(12) United States Patent
Budde et al.

(10) Patent No.: US 10,136,528 B2
(45) Date of Patent: Nov. 20, 2018

(54) COUPLING UNIT AND INDUSTRIAL CONTROL SYSTEM

(71) Applicant: Beckhoff Automation GmbH, Verl (DE)

(72) Inventors: Torsten Budde, Gütersloh (DE); Michael Jost, Dörentrup (DE)

(73) Assignee: BECKHOFF AUTOMATION GMBH, Verl (DE)

( * ) Notice: Subject to any disclaimer, the term of this patent is extended or adjusted under 35 U.S.C. 154(b) by 492 days.

(21) Appl. No.: 14/816,273

(22) Filed: Aug. 3, 2015

(65) Prior Publication Data

US 2016/0037660 A1    Feb. 4, 2016

(30) Foreign Application Priority Data

Aug. 4, 2014 (DE) .................. 10 2014 111 030

(51) Int. Cl.
| | |
|---|---|
| *H05K 1/02* | (2006.01) |
| *H05K 5/00* | (2006.01) |
| *H01R 12/70* | (2011.01) |
| *H01R 24/62* | (2011.01) |
| *H05K 7/14* | (2006.01) |

(52) U.S. Cl.
CPC ....... *H05K 5/0065* (2013.01); *H01R 12/7076* (2013.01); *H01R 24/62* (2013.01); *H05K 7/1465* (2013.01); *H05K 7/1475* (2013.01); *H05K 7/1484* (2013.01)

(58) Field of Classification Search
CPC .. H05K 5/0065; H05K 7/1484; H05K 7/1475; H05K 7/1465; H01R 24/62; H01R 12/7076

USPC .......................................... 307/42
See application file for complete search history.

(56) References Cited

U.S. PATENT DOCUMENTS

| | | |
|---|---|---|
| 2004/0206613 A1 | 10/2004 | Ward |
| 2013/0173868 A1 | 7/2013 | Leyrer et al. |

FOREIGN PATENT DOCUMENTS

| | | |
|---|---|---|
| DE | 3740290 C2 | 1/1997 |
| DE | 02006031129 A1 | 1/2007 |
| DE | 102006031129 A1 | 4/2009 |

(Continued)

OTHER PUBLICATIONS

German Office Action for related German application No. DE 10 2014 111 030.7, dated Sep. 24, 2014 (8 pages).

(Continued)

*Primary Examiner* — Richard Tan
(74) *Attorney, Agent, or Firm* — Dorsey & Whitney LLP

(57) ABSTRACT

A coupling unit for an industrial control system has two module connections for making electrical contact with control modules, a field connection for making electrical contact with an industrial field device, a data transmission medium for the transmission of communication data, and a signal transmission medium for the transmission of field signals. Each of the two module connections comprise electrical contact elements which form a communication signal region and a field signal region. Contact elements of the communication signal regions of each of the two module connections are connected in an electrically conductive manner to the data transmission medium, and contact elements of the field signal regions of each of the two module connections are connected to the field connection via the signal transmission medium.

23 Claims, 12 Drawing Sheets

(56) References Cited

FOREIGN PATENT DOCUMENTS

DE   202010006065 U1   8/2010
EP        2227072 A2   9/2010

OTHER PUBLICATIONS

"A High Speed Image Processing System Utilized in Autonomous Vehicle Guidance," IAPR Workshop of CV—Special Hardware and Industrial Applications, Oct. 12-14, 1988, pp. 10-13.
"Prozessoren, Systeme und Produkte," RISC—Workstation—Architekturen, 1991 (18 pages).

COUPLING UNIT AND INDUSTRIAL CONTROL SYSTEM

CROSS-REFERENCE TO RELATED APPLICATION

This application claims priority to German Patent Application DE 10 2014 111 030.7, filed Aug. 4, 2014, entitled KOPPELEINHEIT UND INDUSTRIELLES STEUERUNGSSYSTEM, which is incorporated by reference herein, in the entirety and for all purposes.

FIELD

The present invention relates to a coupling unit for an industrial control system and to an industrial control system.

BACKGROUND

In automation technology, industrial control systems are used for installation, machine and process control, for example in order to control and monitor production processes or packaging processes. An industrial control system generally has a field level or process level with field devices and a control level with control devices. In industrial process automation, actuators, such as drives or valves, and measuring transducers, such as coders and sensors, are used, inter alia, as field devices.

The control level comprises, inter alia, devices for programming, controlling, monitoring and visualizing the processes to be carried out. In this case, programmable logic controllers (PLC) or control computers, for instance industrial PCs, are generally used. A control computer may be used, for example, as a process control computer on a production line.

Field bus systems which transmit communication data via a data network are usually used for communication between the control level and the field level. The communication data may be, inter alia, control commands for controlling field devices or else measurement data. The measurement data may be based, for example, on measurement variables which have been previously recorded by a field device. Field bus systems use different protocols to transmit data. One possible data transmission protocol is the EtherCAT protocol which enables real-time communication via an Ethernet network and is specified in the IEC 61158 standard. In the case of data transmission according to the EtherCAT standard, data messages are used to transmit the communication data. The data messages contain control data, which control the distribution and processing of the data messages in the field bus system, and useful data which comprise, inter alia, the communication data.

Field bus systems may be configured in different network topologies which describe the arrangement of the individual bus subscribers inside the field bus system. In the case of a ring topology, all bus subscribers are successively connected in series. Data packets containing the communication data pass through, starting from a first bus subscriber, all other bus subscribers in sequence which can replace communication data with the data packets. The data packets are then transmitted back to the first bus subscriber again. A variant of the ring topology is the line topology which represents an open ring. After the data packets have passed through all bus subscribers in sequence, the data packets are transmitted back to the first bus subscriber in the opposite direction via the bus subscribers. The first bus subscriber is generally a device on the control level, for instance a control computer.

A field bus system with real-time capability in a line topology can be implemented using the EtherCAT standard described in the IEC 61158 standard. In the case of the EtherCAT standard, the Ethernet standard or the E-bus standard, which is based on low-voltage differential signaling (LVDS), can be used, inter alia, on the physical layer. LVDS is a conductor-connected or wired transmission technology which uses differential voltage levels to transmit data and is specified in the ANSI/TIA/EIA-644-1995 standard. In the case of E-bus systems, the transmission of data is based on a current flow through a two-wire transmission line, which current flow is generated by a constant current source, binary logic values being represented by the direction of current flow. The impedance of the transmission line is generally approximately 100-120 ohms. LVDS can be used to achieve data rates of several 100 Mbit/s or some Gbit/s. Data messages which encapsulate the EtherCAT data messages are used to transmit the communication data in an E-bus system.

The different field devices used for process control, such as drives or sensors, generally do not have their own integrated interface to the field bus. They are therefore not directly controlled via the digital communication data, but rather transmit or receive digital or analog field signals. Field signals can also be called process signals. The field signals may be, for example, analog or digital voltage levels. The individual field devices accordingly usually have one or more digital or analog inputs and outputs. If the field devices are in the form of motors or drives, they can also be controlled using regulated currents which can also transmit high drive powers under certain circumstances.

Control modules are usually used to convert the communication data into the field signals. The control modules are connected both to the devices on the control level via the field bus system and to the field devices via field signal lines. The control modules may be in the form of digital or analog input modules or may be in the form of digital or analog output modules.

If they are output modules, the control modules receive control commands from the devices on the control level as communication data via the field bus system. On the basis of the control commands, the output modules generate outgoing field signals which may consist, inter alia, of analog or digital voltage signals or regulated currents. The field signals are output via output connections of the control modules. The outgoing field signals are then transmitted to the field devices via the field signal lines. The outgoing field signals may be used, inter alia, to control drives, motors or valves.

If the control modules are input modules, the control module receives incoming field signals which may consist, inter alia, of analog or digital voltage or current signals. The input module converts the field signals into communication data which may represent, for instance, measured voltage or current values. The control module can then transmit the communication data to the devices on the control level, for example to a control computer, via the field bus system.

The control modules typically provide a plurality of connections for the field signals. In this case, a control module may have only connections of one type, for instance only input connections or only output connections or only digital or only analog connections. If both analog and digital field signals are needed to operate a field device or if both inputs and outputs are needed to operate a field device, the corresponding signal lines are usually connected to a plurality of different control modules. The signal lines of different control modules which are required for a field device or for a group of field devices can be combined to form signal line bundles. The individual signal line bundles are then laid to the different field devices. The practice of combining the individual signal lines to form field-device-specific signal line bundles is also referred to as signal routing or signal distribution.

Coupling units which accommodate a plurality of control modules on a mechanical carrier are used, inter alia, to hold the control modules. The control modules are generally in the form of top-hat rail terminals and are mounted beside one another on a coupling unit in the form of a top-hat rail. Top-hat rails are described in the DIN EN 6071 standard, for example. The data connection between the control modules in the form of top-hat rail terminals is generally effected using contact devices fitted to the side of the control modules. If the control modules on the top-hat rail are pushed together, electrical contact for the purpose of communicating data is established via the contact devices of adjacent modules. In a similar manner, voltage can also be supplied to the control modules via contact devices fitted to the side of the control modules.

In the case of control modules in the form of top-hat rail terminals, the field signals for the field devices are generally output or read in at connections which are arranged on a front side of the control modules which faces away from the top-hat rail. The connections are generally in the form of spring loaded contacts. In order to combine all field signals intended for a field device or a group of field devices during signal routing, signal lines connected to the connections can be cross-wired to field-device-specific connection elements. In this case, the field-device-specific connection elements combine all signal lines intended for a field device or a group of field devices and are generally likewise in the form of spring loaded contacts.

Such top-rail terminals are previously known, for example, from DE 44 02 002 B4.

SUMMARY

An object of the invention is to provide an improved coupling unit for an industrial control system and an improved industrial control system.

According to a first aspect a coupling unit for an industrial control system has two module connections for making electrical contact with control modules, a field connection for making electrical contact with an industrial field device, a data transmission medium for the transmission of communication data, and a signal transmission medium for the transmission of field signals. Each of the two module connections comprise electrical contact elements which form a communication signal region and a field signal region. Contact elements of the communication signal regions of each of the two module connections are connected in an electrically conductive manner to the data transmission medium, and contact elements of the field signal regions of each of the two module connections are connected to the field connection via the signal transmission medium.

According to a second aspect an industrial control system has a coupling unit, a control module, and a converter module. The coupling unit has a module connection and a converter module connection, the module connection comprises electrical contact elements, which form a communication signal region and a field signal region, and the converter module connection comprises electrical contact elements, which form a communication signal region. The contact elements of the communication signal region of the module connection and the converter module connection make electrically conductive contact to a data transmission medium of the coupling unit. The control module is designed to make electrically conductive contact with contact elements of the module connection in order to transmit communication data via the contact elements of the communication signal region of the module connection and to transmit field signals to an industrial field device via the contact elements of the field signal region of the module connection. The converter module is designed to make electrically conductive contact with contact elements of the converter module connection, the converter module has an interface to a superordinate data path, and the converter module is designed to transmit the communication data between the interface to the superordinate data path and contact elements of the communication signal region of the converter module connection.

According to a third aspect an industrial control system has a coupling unit, a control module, and a placeholder module. The coupling unit has a module connection and a further module connection, the module connection and the further module connection each comprising electrical contact elements, which form a communication signal region and a field signal region. The control module is designed to make electrically conductive contact with contact elements of the communication signal region of the module connection in order to transmit communication data and to make electrically conductive contact with contact elements of the field signal region of the module connection in order to transmit field signals. The placeholder module is designed to make electrically conductive contact with contact elements of the communication signal region of the further module connection in order to transmit communication data and the placeholder module is designed to forward communication data to the control module.

BRIEF DESCRIPTION OF THE DRAWINGS

The invention is explained in more detail below using figures, in which, in a schematic illustration in each case.

DETAILED DESCRIPTION

Figure 1:
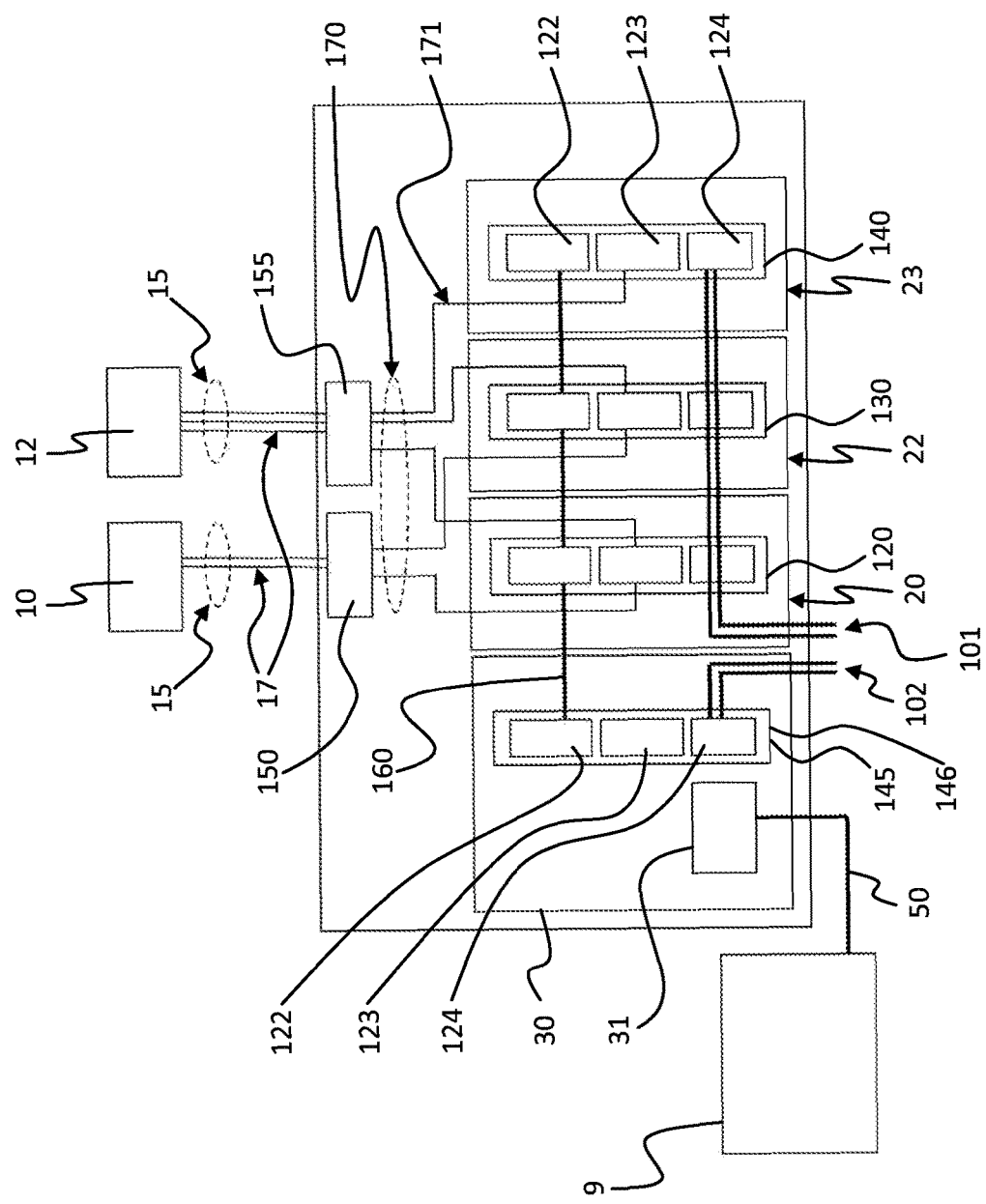
FIG. 1 shows an illustration of an industrial control system according to a first embodiment of the invention.

FIG. 1 shows a schematic illustration of a first industrial control system 1 having a first coupling unit 100. The first coupling unit 100 comprises a first bus board 91 and a plurality of module connections. By way of example, a first module connection 120, a second module connection 130, a third module connection 140 and a fourth module connection 145 are illustrated in FIG. 1. The first coupling unit 100 also comprises a plurality of field connections, a field connection 150 and a further field connection 155 being illustrated. The module connections 120, 130, 140, 145 and the field connections 150, 155 are arranged on the bus board 91 and may each be in the form of elements of an electrical plug-in connection, for instance a male or female connector, for example. The invention is explained in more detail below using figures, in which, in a schematic illustration in each case:

The first bus board 91 may be, for example, in the form of a printed circuit card or a printed circuit board and may comprise a printed circuit. The bus board 91 has an electrically insulating material, for instance a glass-fiber-reinforced plastic, and is preferably in the form of a rigid printed circuit board. The bus board 91 preferably comprises four or more conductor track layers, two of which are respectively arranged on a surface of the bus board 91 and two of which are arranged inside the bus board 91 and are laminated in, for example.

The first module connection 120, the second module connection 130, the third module connection 140 and the fourth module connection 145 are identical, in so far as no differences emerge from the description. The module connections 120, 130, 140, 145 are arranged at a distance from one another in a row on the first bus board 91. In this case, the fourth module connection 145 is arranged at one end of the row. The next connection in the row is the first module connection 120, followed by the second module connection 130. The third module connection 140 is arranged beside the second module connection 130 at the other end of the row. The module connections 120, 130, 140, 145 each have a communication signal region 122, a field signal region 123 and a voltage supply region 124.

The field connections 150, 155 are identical, in so far as no differences emerge from the description. The field connections 150, 155 and the module connections 120, 130, 140, 145 may be situated on the same side of the first bus board 91, but may also be arranged on different sides of the first bus board 91.

The first coupling unit 100 also has a data transmission medium 160 which connects the module connections 120, 130, 140, 145 to one another in sequence in an electrically conductive manner. In this case, the data transmission medium 160 respectively establishes an electrically conductive connection between two adjacent module connections 120, 130, 140, 145 and makes contact with each of the module connections 120, 130, 140, 145 in the communication signal region 122. The data transmission medium 160 connects the fourth module connection 145 to the first module connection 120 and additionally connects the first module connection 120 to the second module connection 130. In addition to the first module connection 120, the second module connection 130 is also connected to the third module connection 140 in an electrically conductive manner via the data transmission medium 160.

The first coupling unit 100 also comprises a signal transmission medium 170 which in turn comprises a plurality of signal lines 171. The first module connection 120 is connected to the field connection 150 in an electrically conductive manner via one of the signal lines 171 of the signal transmission medium 170 and is connected to the further field connection 155 in an electrically conductive manner via a further one of the signal lines 171. The second module connection 130 is connected both to the field connection 150 and to the further field connection 155 in an electrically conductive manner via one of the signal lines 171 in each case. The third module connection 140 is connected to the further field connection 155 in an electrically conductive manner via one of the signal lines 171. The signal lines 171 make contact with each of the module connections 120, 130, 140 in the field signal region 123. The fourth module connection 145 which is used as a converter module connection 146 is not connected to the signal transmission medium 170.

The first coupling unit 100 also comprises a field voltage supply 101. The field voltage supply 101 comprises two voltage lines and is connected in sequence to the first module connection 120, the second module connection 130 and the third module connection 140 in an electrically conductive manner. In this case, the voltage lines of the field voltage supply make contact with each of the module connections 120, 130, 140 in the voltage supply region 124. The fourth module connection 145 which is used as a converter module connection 146 is not connected to the field voltage supply 101.

The data transmission medium 160, the signal lines 171 of the signal transmission medium 170 and the voltage lines of the field voltage supply 101 are each in the form of one or more conductor tracks which are arranged in the conductor track planes of the first bus board 91.

In addition to the first coupling unit 100, the first industrial control system 1 comprises a plurality of control modules which make electrically conductive contact with the module connections 120, 130, 140. A first control module 20 makes contact with the first module connection 120, a second control module 22 makes contact with the second module connection 130 and a third control module 23 makes contact with the third module connection 140. For this purpose, the control modules 20, 22, 23 each comprise a connection element which matches the module connections 120, 130, 140 and is respectively arranged on those sides of the control modules 20, 22, 23 which face the first bus board 91 of the first coupling unit 100. There is electrical contact between the control modules 20, 22, 23 and the data transmission medium 160, the signal transmission medium 170 and the field voltage supply 101 via the module connections 120, 130, 140.

The first industrial control system 1 also comprises a first converter module 30 which makes electrically conductive contact with the fourth module connection 145 which is used as a converter module connection 146. For this purpose, the first converter module 30 has a connection element which is designed like the connection elements of the control modules 20, 22, 23. The first converter module 30 makes contact with the data transmission medium 160 of the first bus board 91 via the fourth module connection 145.

If the module connections 120, 130, 140, 145 are in the form of elements of a plug-in connection, the connection elements of the control modules 20, 22, 23 and of the first converter module 30 may be in the form of male or female connectors matching the module connections 120, 130, 140, 145.

The first converter module 30 has an interface 31 to a superordinate data path 50 and is connected to the superordinate data path 50 via the interface 31. The interface 31 is arranged on the first converter module 30 and may be situated, for example, on a side surface of the first converter module 30 which is opposite a side surface having the connection element. The superordinate data path 50 establishes an electrically conductive connection to a control computer 9 of the first industrial control system 1. The superordinate data path 50 may be, for example, part of a field bus system and may be in the form of an EtherCAT field bus, for example.

In the case of an EtherCAT field bus, the superordinate data path 50 may comprise one or more Ethernet connections which may be wired, for example. The interface 31 of the first converter module 30 may comprise one or more network connections, for example in the form of network female connectors, in such a case. The network female connectors may be in the form of RJ-45 female connectors, for example.

An industrial field device 10 and a further industrial field device 12 are connected to the field connection 150 and to the further field connection 155 via a field signal transmission medium 15 in each case for the purpose of making electrical contact. The field signal transmission media 15 each comprise one or more field signal lines 17. A first one of the field signal transmission media 15 connects the field connection 150 to the industrial field device 10. A second one of the field signal transmission media 15 connects the further field connection 155 to the further industrial field device 12. The industrial field devices 10, 12 may be, for example, drives or measuring transducers having sensors and may be used for process execution and monitoring.

The field signal transmission medium 15 which connects the field connection 150 to the industrial field device 10 combines all field signal lines 17 which are required for the communication between the industrial field device 10 and the control level of the industrial control systems 1 and forms a field signal line bundle. As a result, the industrial field device 10 can be controlled via the field signal transmission medium 15 which may be in the form of a cable or a cable harness, for example. In a similar manner, the field signal transmission medium 15 between the further field connection 155 and the further industrial field device 12 combines all field signal lines 17 for the purpose of controlling the further industrial field device 12.

If the field signal transmission media 15 are in the form of cable harnesses, the field signal lines 17 may be in the form of multicore cables, for example. If the field signal transmission media 15 are each an individual cable, this cable may have a plurality of cores, the field signal lines 17 each comprising one or more of the cores of the cable. The field signal lines 17 and/or the field signal transmission media 15 may have a cable shield and/or twisted wire pairs in order to better shield the field signal lines 17 from electromagnetic interfering influences.

The control modules 20, 22, 23 and the first converter module 30 may be designed to be connected to the module connections 120, 130, 140, 145 and/or to the first bus board 91 via a force-fitting and/or form-fitting connection. This makes it possible to produce a stable mechanical connection between the modules 20, 22, 23, 30 and the first bus board 91. The control modules 20, 22, 23 and the first converter module 30 may have, for example, latching lugs which are arranged beside the connection elements for the module connections 120, 130, 140, 145 and engage in an anchoring manner in recesses in the first bus board 91 which match the latching lugs.

The first converter module 30 is designed to receive communication data from the control computer 9 via the superordinate data path 50 and the interface 31 and to forward the communication data to the control modules 20, 22, 23 via the fourth module connection 145 and the data transmission medium 160. The first converter module 30 is also designed to receive communication data from the control modules 20, 22, 23 via the data transmission medium 160 and to transmit said data to the control computer 9 via the superordinate data path 50.

For communication with the control modules 20, 22, 23, the first converter module 30 has transmitting and receiving devices which are in electrically conductive contact with the data transmission medium 160 via the fourth module connection 145. In a similar manner, the first control module 20, the second control module 22 and the third control module 23 each have transmitting and receiving devices which are in electrically conductive contact with the data transmission medium 160 via the first module connection 120, the second module connection 130 and the third module connection 140.

The data transmission medium 160 forms a field bus in a line topology between the first converter module 30, the first control module 20, the second control module 22 and the third control module 23. The control modules 20, 22, 23 are each designed to receive communication data from an adjacent module via the data transmission medium 160, to process the communication data and to forward said data to a further adjacent module via the data transmission medium 160.

In a corresponding manner, the first control module 20 receives communication data from the first converter module 30 and transmits the communication data to the second control module 22 via the data transmission medium 160 after data processing. The second control module 22 forwards the communication data to the third control module 23 via the data transmission medium 160 after data processing. After the third control module 23 has processed the communication data, it transmits said data back to the second control module 22 via the data transmission medium 160. The communication data are transmitted back to the first converter module 30 from the second control module 22 via the data transmission medium 160 and the first control module 20, which converter module transmits the communication data to the control computer 9 via the superordinate data path 50.

During the data processing of the communication data by the control modules 20, 22, 23, control data and control commands may be read from the communication data by the control modules 20, 22, 23 and may be converted into outgoing field signals. The outgoing field signals can then be transmitted to the field devices 10, 12 via the field signal regions 123 of the module connections 120, 130, 140, the signal transmission medium 170 and the field connections 150, 155. In addition, during the data processing by the control modules 20, 22, 23, incoming field signals which have previously been received by the control modules 20, 22, 23 from the field devices 10, 12 via the module connections 120, 130, 140 can be read into the communication data as measurement data and can be transmitted back to the control computer 9.

The control modules 20, 22, 23 are supplied with a field-side electrical supply voltage via the field voltage supply 101. The control modules 20, 22, 23 are connected to the voltage lines of the field voltage supply 101 in a parallel manner via the module connections 120, 130, 140. The field-side supply voltage can be applied to the field voltage supply 101 as an external voltage via contact units arranged on the first bus board 91 of the first coupling unit 100. In addition, the coupling unit 100 may comprise electronic components which are designed to DC-isolate the field-side supply voltage from the externally applied voltage. The field-side supply voltage may be a DC voltage, for example, and may be 24 V.

In order to supply the first converter module 30 with voltage, the first coupling unit 100 comprises a bus-side voltage supply 102. The bus-side voltage supply 102 may comprise one or more voltage lines which may be in the form of conductor tracks, for example, on the first bus board 91. The bus-side voltage supply 102 makes contact with the voltage supply region 124 of the fourth module connection 145 which is used as a converter module connection 146. Like in the case of the field-side supply voltage, an external voltage can be applied to the bus-side voltage supply 102 via contact units formed on the first bus board 91. The voltages of the bus-side voltage supply 102 and of the field voltage supply 101 may be DC-isolated in order to prevent transmission of electromagnetic interference between communication signals, which represent the communication data, and the field signals.

Figure 2:
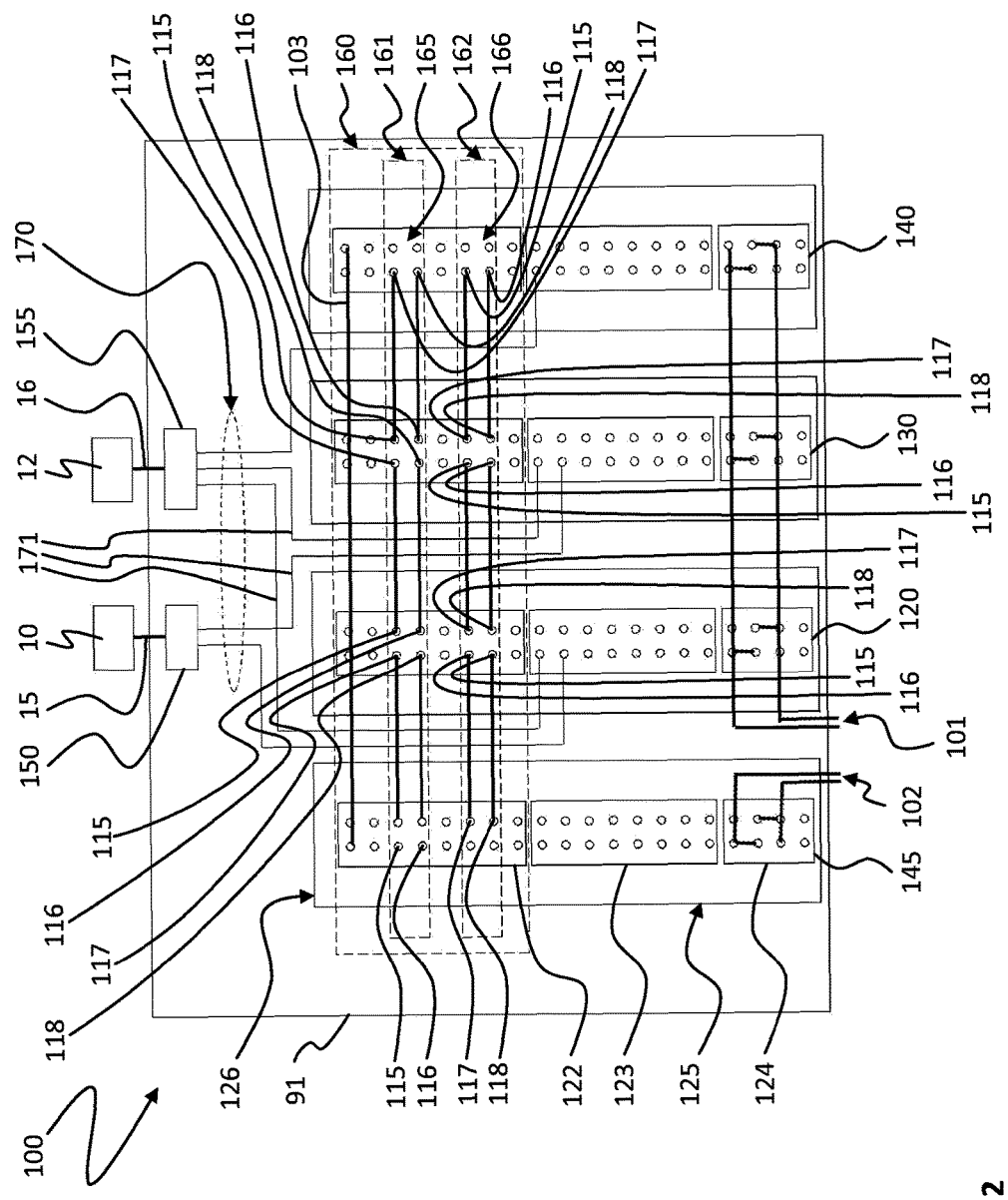
FIG. 2 shows an illustration of a first bus board of a first coupling unit of the industrial control system according to the first embodiment.

FIG. 2 shows a section of the first coupling unit 100, which illustrates the more precise configuration of the data transmission medium 160, the signal transmission medium 170 and the voltage supplies 101, 102. The first module connection 120, the second module connection 130, the third module connection 140 and the fourth module connection 145 used as a converter module connection 146 are substantially identical. The module connections 120, 130, 140, 145 are each rectangular and each have two long sides 125 and two short sides 126. The module connections 120, 130, 140, 145 are arranged parallel to one another along the long sides 125 and are arranged at a distance from one another on the first bus board 91. The short sides 126 of the module connections 120, 130, 140, 145 are aligned flush.

The module connections 120, 130, 140, 145 each have forty electrical contact elements 110. Sixteen of the contact elements 110 form the communication signal region 122, sixteen further contact elements of the contact elements 110 form the field signal region 123 and eight of the contact elements 110 form the voltage supply region 124 of the module connections 120, 130, 140, 145. The contact elements 110 of the communication signal region 122, of the field signal region 123 and of the voltage supply region 124 are each arranged adjacent to one another in this case. The contact elements 110 may be in the form of contacts of an electrical plug-in connection, for example, and may be contact pins or contact sleeves, for example.

The electrical contact elements 110 are arranged in two contact rows which are parallel to the long side 125 of the module connections 120, 130, 140, 145 and each have twenty contact elements 110. Eight contact elements 110 of the communication signal region 122 or of the field signal region 123 and four contact elements 110 of the voltage supply region 124 are respectively arranged beside one another in the two contact rows. The contact elements 110 of the field signal region 123 are arranged between the contact elements 110 of the communication signal region 122 and the contact elements 110 of the voltage supply region 124.

Figure 3:
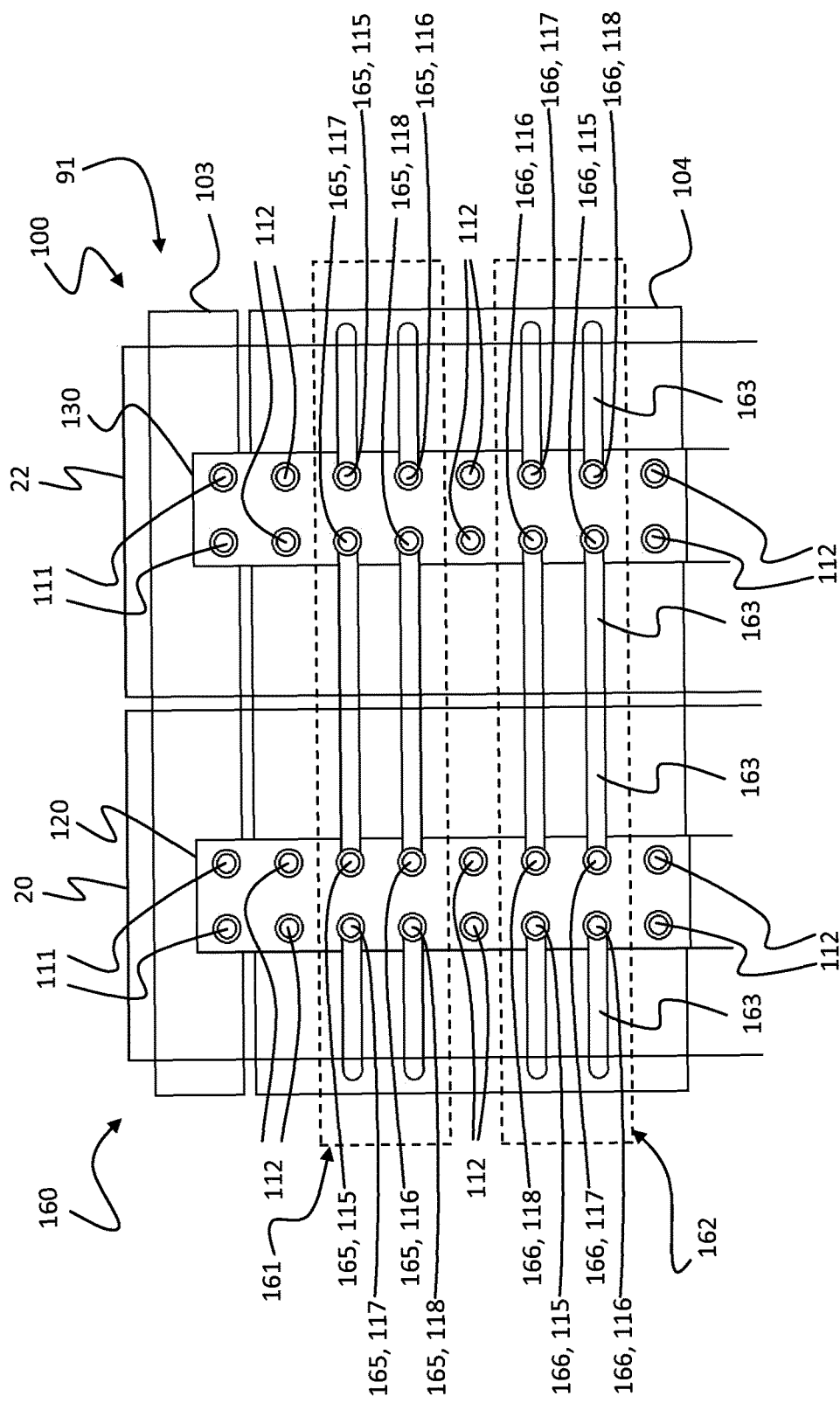
FIG. 3 shows an illustration of communication signal regions of two module connections of the first bus board.

The contact elements 110 of the communication signal regions 122 of all module connections 120, 130, 140, 145 are connected to the data transmission medium 160 substantially in the same manner. The function of the contact elements 110 of the communication signal regions 122 is explained in more detail using the communication signal regions 122 of the first module connection 120 and of the second module connection 130, as illustrated in FIG. 3.

The two outermost contact elements 110 of the communication signal regions 122, which are each arranged on one of the short sides 126 of the module connections 120, 130, 140, 145, act as voltage contact elements 111 and are each connected to a bus voltage line 103 of the data transmission medium 160 in an electrically conductive manner parallel to one another. The transmitting and receiving units of the control modules 20, 22, 23 and of the first converter module 30 can be supplied with an electrical bus voltage via the bus voltage line 103 and the voltage contact elements 111. The converter module 30 may be designed, for example, to generate the bus voltage from the external voltage applied to the bus-side voltage supply 102, for instance using a voltage converter.

The next two contact elements 110 of the communication signal region 122, which are arranged beside the voltage contact elements 111, form ground contact elements 112 and are each connected to a ground plane 104 of the data transmission medium 160 in an electrically conductive manner. The ground plane 104 may be in the form of a contiguous conductor surface of the first bus board 91, for example, and may be arranged on one or both surfaces of the first bus board 91. The ground plane 104 may completely cover, for example, that region of the first bus board 91 in which the data transmission medium 160 is arranged and may thus shield the data transmission medium 160 from external electromagnetic interference.

The ground contact elements 112 are adjoined by a first number 165 of a total of four contact elements 110, two of the contact elements 110 of the first number 165 respectively being arranged in one of the two contact rows. In this case, a contact row comprises a transmitting contact element 115 and an adjacent further transmitting contact element 116, and the other of the contact rows comprises a receiving contact element 117 and an adjacent further receiving contact element 118.

The first number 165 of contact elements 110 is adjoined by a second number 166 of contact elements 110, separated by a ground contact element 112 for each contact row. The second number 166 in turn comprises a total of four contact elements 110, two contact elements 110 being arranged in each of the two contact rows. In one of the contact rows, the ground contact elements 112 are respectively followed by a receiving contact element 117 and a further receiving contact element 118 and are followed by a transmitting contact element 115 and a further transmitting contact element 116 in the other contact row. In this case, the receiving contact elements 117, 118 of the second number 166 of contact elements 110 are arranged in the contact row in which the transmitting contact elements 115, 116 of the first number 165 of contact elements 110 are situated. The transmitting contact elements 115, 117 of the second number 166 of contact elements 110 are arranged in the contact row in which the receiving contact elements 117, 118 of the first number 165 of contact elements 110 are situated. The second number 166 of contact elements 110 is respectively adjoined by two ground contact elements 112 for each contact row in the communication signal region 122.

The data transmission medium 160 has a first data channel 161 and a second data channel 162. The data channels 161, 162 each comprise a plurality of data lines 163. The transmitting contact elements 115, 116 and the receiving contact elements 117, 118 of the first number 165 of contact elements 110 are connected to the data lines 163 of the first data channel 161 in an electrically conductive manner. The transmitting contact elements 115, 116 and receiving contact elements 117, 118 of the second number 166 make contact with the data lines 163 of the second data channel 162.

The data lines 163 may be in the form of conductor tracks of the first bus board 91. They may be arranged, for example, in conductor track layers which are situated inside the first bus board 91. The ground plane 104 of the data transmission medium 160 may be arranged on the surfaces of the first bus board 91, for example above and/or below the data lines 163.

The data lines 163 always connect one of the transmitting contact elements 115 of one of the module connections 120, 130, 140, 145 to one of the receiving contact elements 117 of the adjacent module connection 120, 130, 140, 145 and connect one of the further transmitting contact elements 116 to one of the further receiving contact elements 118 of the adjacent module connection 120, 130, 140, 145. One of the data lines 163 therefore connects the transmitting contact element 115 of the first number 165 of contact elements 110 of the first module connection 120 to the receiving contact element 117 of the first number 165 of contact elements 110 of the second module connection 130. A further one of the data lines 163 connects the further transmitting contact element 116 of the first number 165 of contact elements 110 of the first module connection 120 to the further receiving contact element 118 of the first number 165 of contact elements 110 of the second module connection 130. The transmitting contact elements 115, 116 of the second number 166 of contact elements 110 of the second module connection 130 are likewise each connected to the receiving contact elements 117, 118 of the second number 166 of contact elements 110 of the first module connection 120 via a respective one of the data lines 163.

As illustrated in FIG. 3 and FIG. 2, the communication signal region 122 of the third module connection 140 is connected to the second module connection 130 in a similar manner via the first data channel 161 and the second data channel 162 of the data transmission medium 160. Since the third module connection 140 is not connected to a further module connection, contact is not made with the transmitting contact elements 115, 116 of the first number 165 of contact elements 110 of the third module connection 140. Just as little contact is made with the receiving contact elements 117, 118 of the second number 166 of contact elements 110 of the third module connection 140.

In a similar manner to how the third module connection 140 is connected to the second module connection 130, the fourth module connection 145 illustrated in FIG. 2 is connected to the first module connection 120 via the first data channel 161 and the second data channel 162 of the data transmission medium 160. As illustrated in FIG. 2, in the case of the fourth module connection 145, the receiving contact elements 117, 118 of the first number 165 of contact elements 110 and the transmitting contact elements 117, 118 of the second number 166 of contact elements 110 are not connected to the data transmission medium 160.

The ground plane 104 of the data transmission medium 160 forms a contiguous ground plane which extends across all module connections 120, 130, 140, 145 of the bus board 91 of the first coupling unit 100. The ground plane 104 may be simultaneously formed both in the uppermost and in the lowermost conductor track plane of the first bus board 91. The data lines 163 may then be formed in conductor track planes arranged inside the first bus board 91, with the result that the data lines 163 on both top sides of the bus board 91 are shielded by the ground plane 104 of the data transmission medium 160.

The dimensions of and distances between the data lines 163 and the distances between the data lines 163 and the ground plane 104 of the data transmission medium 160 are preferably selected in such a manner that the data lines 163 of a data channel 161, 162 each have a differential impedance of 100 ohms. The conductor track planes inside the first bus board 91, in which the data lines 163 are arranged, may likewise be occupied by the ground plane 104 between the data lines 163 for better shielding against electromagnetic interference.

The data lines 163 of the first data channel 161 and of the second data channel 162 always each connect only one of the transmitting contact elements 115, 116 of one of the module connections 120, 130, 140, 145 to one of the receiving contact elements 117, 118 of another of the module connections 120, 130, 140, 145. In this respect, the first data channel 161, the second data channel 162 and, with the latter, the data transmission medium 160 as well are each interrupted in the communication signal region 122 of the module connections 120, 130, 140, 145 and only direct connections or point-to-point connections are respectively implemented between the module connections 120, 130, 140, 145. The data transmission medium 160 configured in this manner may act as a field bus system, for example, and may be used, for example, for an E-bus connection between the module connections 120, 130, 140, 145.

Communication data can be forwarded from the first converter module 30 connected to the fourth module connection 145 to the third control module 23 at the third module connection 140 via the first control module 20 at the first module connection 120 and via the second control module 22 at the second module connection 130 using the data lines 163 of the first data channel 161. In this case, the first control module 20, the second control module 22 and the third control module 23 respectively receive the communication data via the first and second receiving contact elements 117, 118 connected to the first data channel 161. After the communication data have been processed, the first control module 20 and the second control module 22 each forward the communication data via the transmitting contact elements 115, 116 connected to the first data channel 161.

Following reception via the receiving contact elements 117, 118 connected to the first data channel 161 and following processing of the communication data, the third control module 23 transmits the communication data back to the second control module 22 at the second module connection 130 via the transmitting contact elements 115, 116 connected to the second data path 162. The communication data are then transmitted back to the first converter module 30 via the second control module 22 and the first control module 20 at the first module connection 120 using the second data channel 162. The first converter module 30 may then transmit the communication data to the control computer 9 via the superordinate data path 50. Overall, simultaneous bidirectional communication can be effected between the module connections 120, 130, 140, 145 and the modules 20, 22, 23, 30 connected to the latter via the first data path 161 and the second data path 162 of the data transmission medium 160.

As illustrated in FIG. 2, contact is made with the contact elements 110 of the field signal regions 123 of the module connections 120, 130, 140, 145 by the signal lines 171 of the signal transmission medium 170. The contact elements of the field signal regions 123 are connected to the field connections 150, 155 via the signal lines 171. By way of example, one of the field signal lines 171 connects one of the contact elements 110 of the field signal region 123 of the first module connection 120 to the field connection 150. A further one of the contact elements 110 of the field signal region 123 of the first module connection 120 is connected to the further field connection 155 via a further one of the field signal lines 171. Although not illustrated, the remaining contact elements 110 of the field signal region 123 of the first module connection 120 may likewise be connected to the field connection 150 or to the further field connection 155 via the field signal lines 171.

In a similar manner, the contact elements 110 of the field signal region 123 of the second module connection 130 and of the third module connection 140 may be connected to the field connection 150 and to the further field connection 155 via the signal lines 171. In FIG. 2, one of the signal lines 171 respectively establishes a connection between one of the contact elements 110 of the field signal region 123 of the second module connection 130 and the field connection 150 or the further field connection 155. FIG. 2 also illustrates a connection between one of the contact elements 110 of the field signal region 123 of the third module connection 140 and the further field signal region 155 via one of the signal lines 171.

The first converter module 30 is used solely to convert communication data from the superordinate data path 50 to the data transmission medium 160 of the first coupler module 100 and vice versa. Accordingly, none of the signal lines 171 of the signal transmission medium 170 is connected to the contact elements 110 of the field signal region 123 of the fourth module connection 145 constituting the converter module connection 146.

Field signals from the first control module 20 and from the second control module 22 are combined on the field connection 150. A field device which uses the corresponding field signals from the first control module 20 and from the second control module 22 must only be connected to the field connection 150. This can be carried out, for example, using an individual multicore cable or an individual cable harness comprising a plurality of cables. In a similar manner, the further field connection 155 combines field signals from the first control module 20, from the second control module 22 and from the third control module 23.

As illustrated in FIG. 2, a total of eight contact elements 110 form the voltage supply regions 124 of the module connections 120, 130, 140. In this case, three of the eight contact elements 110, namely the two contact elements 110 adjoining the field signal region 123 and a further contact element 110 arranged beside these two contact elements 110, are connected to one of the voltage lines of the field voltage supply 101. Three further contact elements 110 adjoining the first three contact elements 110 are connected to the other voltage line of the field voltage supply 101. The remaining two contact elements 110 of the voltage supply region 124, which are situated at an edge of the voltage supply region 124 facing away from the field signal region 123, are connected to a housing ground of the first coupling unit 100 in an electrically conductive manner.

The first, second and third module connections 120, 130, 140 are connected to the field voltage supply 101 in a parallel manner. The contact elements 110 of the voltage supply region 124 of the fourth module connection 145 are connected to the bus-side voltage supply 102 in the same manner as that in which the contact elements 110 of the voltage supply regions 124 of the first, second and third module connections 120 are connected to the field voltage supply 101.

Figure 4:
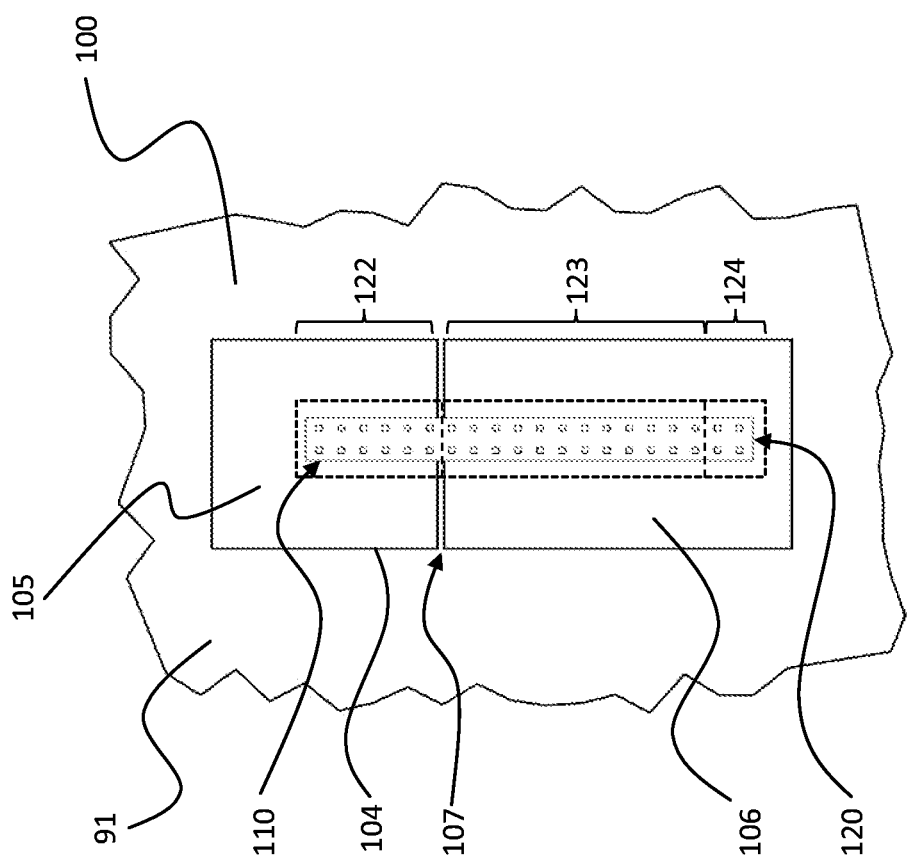
FIG. 4 shows a plan view of a first module connection of the first bus board of the industrial control system according to the first embodiment.

FIG. 4 shows, by way of example, an illustration of conductor track regions of the first bus board 91 at the first module connection 120. The communication signal region 122 of the first module connection 120 is arranged in a bus conductor region 105. The bus conductor region 105 comprises all conductor tracks of the data transmission medium 160. These include, inter alia, in addition to the ground plane 104, the data lines 163 and the bus voltage line 103.

The contact elements 110 of the field signal region 123 and of the voltage supply region 124 of the first module connection 120 are arranged in a field conductor region 106. The field conductor region 106 comprises, inter alia, the conductor tracks of the signal transmission medium 170 having the signal lines 171 and the conductor tracks of the field voltage supply 101. Like the bus conductor region 105, the field conductor region 106 may also be partially or completely covered by a ground plane which may be arranged on one of the surfaces or on both surfaces of the bus board 91.

The bus conductor region 105 and the field conductor region 106 extend across all module connections 120, 130, 140, 145 of the first bus board 91. The contact elements 110 of the second, third and fourth module connections 130, 140, 145 are each arranged in the field conductor region 106 and in the bus conductor region 105, like the contact elements 110 of the first module connection 120. The ground plane 104 of the data transmission medium 106 likewise forms a contiguous ground plane which extends across all module connections 120, 130, 140, 145 of the bus board 91 of the first coupling unit 100.

The conductor tracks of the bus conductor region 105 and of the field conductor region 106 are DC-isolated from one another. The conductor tracks of the field conductor region 106 are each at least at a distance 107 from the conductor tracks of the bus conductor region 105. The distance 107 forms an air gap at the module connections 120, 130, 140, 145 and forms an electrical leakage path between the conductors of the field conductor region 106 and of the bus conductor region 105 on and in the first bus board 91. The distance 107 is preferably more than 0.5 mm, even more preferably 1.2 mm and produces a dielectric strength of at least 500 V.

In an alternative configuration of the first coupling unit 100, the module connections 120, 130, 140, 145, the field connections 150, 155, the data transmission medium 160 and the signal transmission medium 170 may also be formed on or at another carrier device instead of being formed on the first bus board 91. For example, the coupling unit 100 may comprise, as a carrier device, a housing, for example a plastic or metal housing, on which the module connections 120, 130, 140, 145 and the field connections 150, 155 are arranged. The data transmission medium 160 and the signal transmission medium 170 may be implemented using lines arranged on or in the housing, for example using cables or wires. The field-device-specific signal routing between the module connections 120, 130, 140 and the field connections 150, 155 is carried out by the signal transmission medium 170 of the first coupling unit 100.

Figure 5:
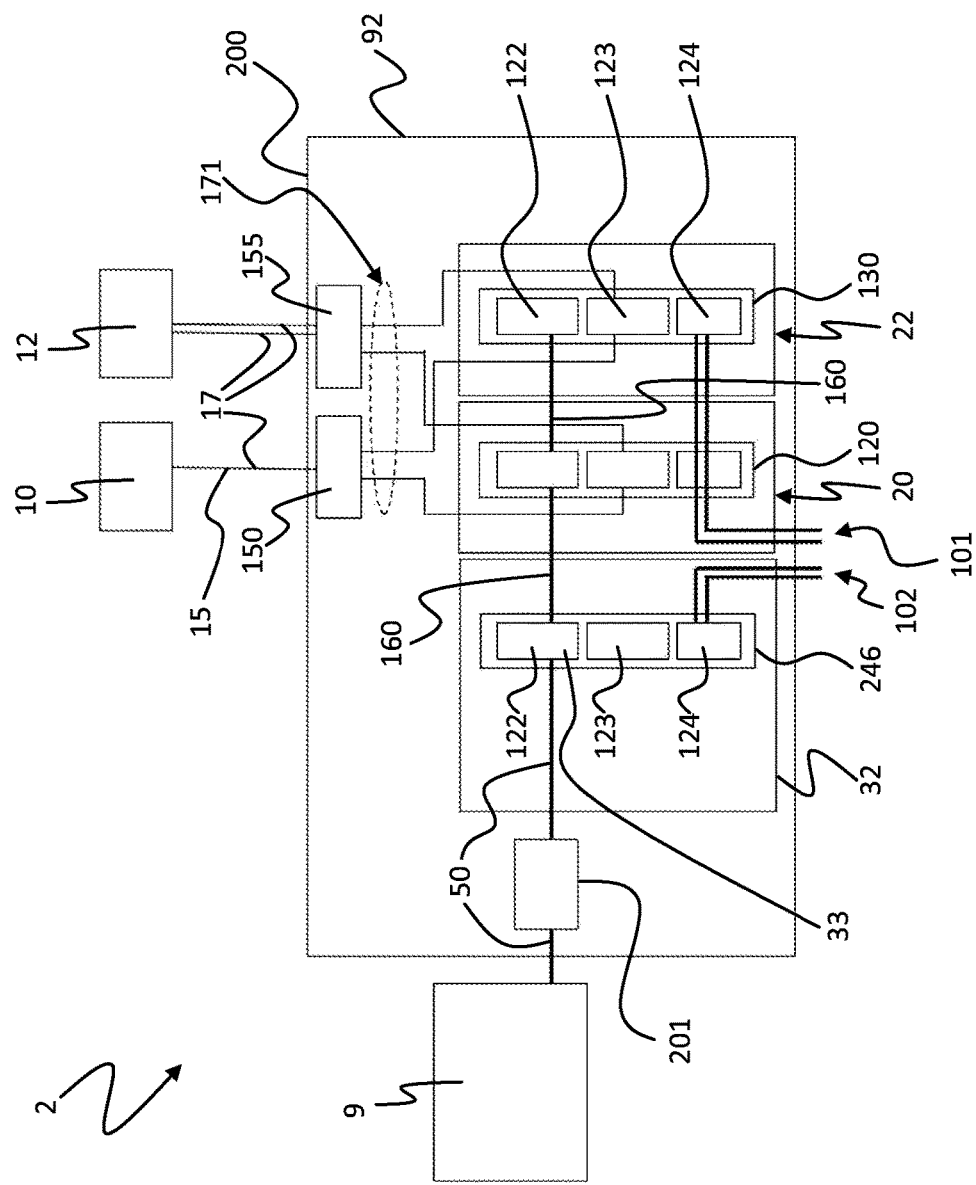
FIG. 5 shows an illustration of an industrial control system according to a second embodiment of the invention.

FIG. 5 shows a schematic illustration of a second industrial control system 2 having a second coupling unit 200. If no differences are described, the second industrial control system 2 and the second coupling unit 200 are designed in the same manner as the first industrial control system 1 and the first coupling unit 100. In this respect, at least partially identical reference symbols are used.

The second coupling unit 200 comprises a second bus board 92. If no differences are described, the second bus board 92 is designed in the same manner has the first bus board 91. In particular, the second bus board 92 as the first module connection 120, the second module connection 130, the field connection 150, the further field connection 155, the data transmission medium 160 and the signal transmission medium 170.

The second industrial control system 2 also comprises the first control module 20 and the second control module 22. Instead of the first converter module 30, a second converter module 32 is arranged on the second coupling unit 200. If no differences are described, the second converter module 32 is designed in the same manner as the first converter module 30. In particular, the second converter module 32 has a connection element for connection to a further converter module connection 146 of the second bus board 92. Unlike in the first converter module 30, the interface 33 to the superordinate data path 50 is integrated in the connection element for the further converter module connection 246 in the second converter module 32 and contact is made with the interface 33 by the further converter module connection 246 of the second bus board 92.

If no differences are described, the further converter module connection 246 of the second coupling unit 200 is designed and contacted like the fourth module connection 145 of the first coupling unit 100, which acts as a converter module connection 146. In order to make contact with the interface 33 of the second converter module 32, a part of the superordinate data path 50 is arranged on the second bus board 92 of the second coupling unit 200. This part of the superordinate data path 50 is formed by conductor tracks on the second bus board 92.

The second bus board 92 has a coupling device 201 which connects that part of the superordinate data path 50 which runs on the second bus board 92 to the remaining superordinate data path 50 and to the control computer 9. The coupling device 201 may have, for example, one or more female or male connectors for network cables. For example, the coupling device 201 may have two RJ-45 female connectors. The coupling device 201 may be situated, for example together with the field connections 150, 155, on a side of the second bus board 92 opposite the module connections 120, 130, 246.

That part of the superordinate data path 50 which is arranged on the second bus board 92 is connected to contact elements 110 in the communication signal region 122 of the further converter module connection 146 of the second coupling unit 200. These contact elements 110 may be arranged, for example, adjacent to the transmitting contact elements 115, 116 connected to the first data channel 161 and adjacent to the receiving contact elements 117, 118 connected to the second data channel 162 and may be situated in the contact row beside the transmitting contact elements 115, 116 and receiving contact elements 117, 118.

Figure 6:
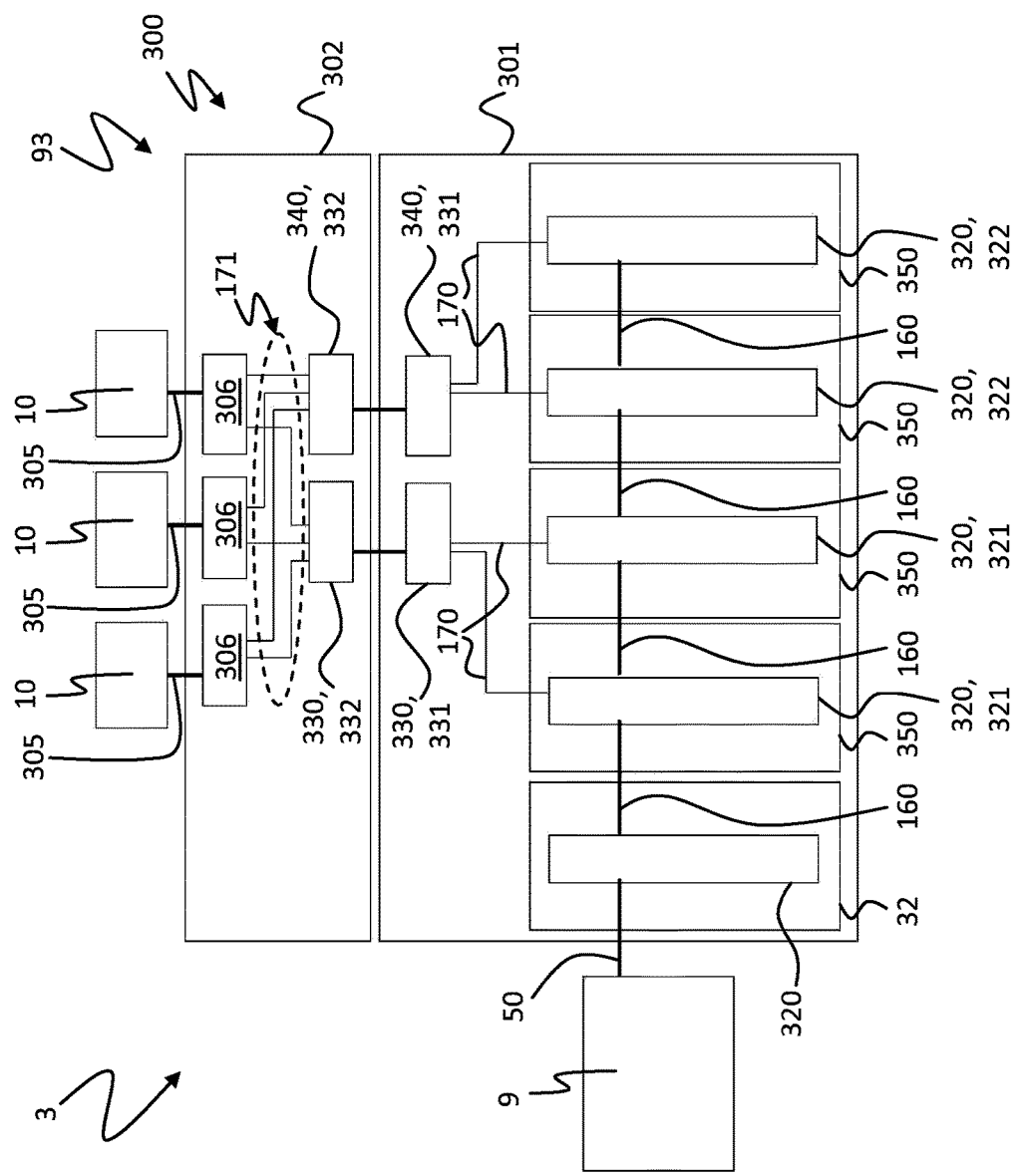
FIG. 6 shows an illustration of an industrial control system according to a third embodiment of the invention.

FIG. 6 shows a third industrial control system 3 which comprises a third coupling unit 300 having a third bus board 93. If no differences are described, the third industrial control system 3, the third coupling unit 300 and the third bus board 93 are designed in the same manner as the first and second control systems 1, 2, the first and second coupling units 100, 200 and the first and second bus boards 91, 92. In this respect, at least partially identical reference symbols are used.

The third bus board 93 comprises a module connection board 301 and a field connection board 302. The module connection board 301 and the field connection board 302 may be in the form of two separate printed circuit boards, for example. Module connections 320 which are designed in the same manner as the first, second, third and fourth module connections 120, 130, 140, 145 of the first coupling unit 100 are arranged on the module connection board 301.

Three field connections 360 are arranged on the field connection board 302. The field connections 360 are designed in the same manner as the field connections 150, 155 and each make contact with one of the industrial field devices 10 via a respective field signal transmission medium 305. The field signal transmission media 305 are designed in the same manner as the field signal transmission media 15 and may have, in particular, a different number of field signal lines 17.

The module connection board 301 and the field connection board 302 are connected to one another in an electrically conductive manner via a first connecting element 330 and a second connecting element 340. The connecting elements 330, 340 may be electrical plug-in connections, for example. In FIG. 6, a male connector 331 of the first connecting element 330 is arranged on the module connection board 301 and a female connector 332 matching the male connector 331 is arranged on the field connection board 302. The male connector 331 of the second connecting element 340 is likewise arranged on the module connection board 301 and the female connector 332 of the second connecting element 340 is arranged on the field connection board 302.

In addition to the electrical connection, the first connecting element 330 and the second connecting element 340 may also establish a mechanical connection between the module connection board 301 and the field connection board 302. The male connectors 331 of the first and second connecting elements 330, 340 may also be arranged on the field connection board 302 and the female connectors 332 may be arranged on the module connection board 301. Only one connecting element or more than the two connecting elements 330, 340 may also be used for the connection between the module connection board 301 and the field connection board 302.

The third coupling unit 300 has a total of five module connections 320 on the module connection board 301. As described in connection with the first coupling unit 100 and the second coupling unit 200, the module connections 320 are connected to one another via the data transmission medium 160. In particular, the module connections 320 make contact with the data transmission medium 160 in the manner illustrated in FIG. 3. As likewise described in connection with the first and second coupling units 100, 200, four of the module connections 320 each make contact with a control module 350. The control modules 350 are designed in the same manner as the first, second and third control modules 20, 22, 23. The converter module 32 already described in connection with the second industrial control system 2 is connected to the fifth of the module connections 320 and makes contact with the control computer 9 via the superordinate data transmission path 50 partially formed on the module connection board 301.

The field signal regions 123 of the module connections 320 are connected to the connecting elements 330, 340 via the signal transmission medium 170. In accordance with the number of contact elements 110 of the field signal regions 123, up to sixteen signal lines 171 can be used for the connection for each module connection 320. A first group 321 of module connections 320, which may consist of two adjacent module connections 320, is connected to the first connecting element 330 in an electrically conductive manner via the signal transmission medium 170 of the third coupling unit 300. A second group 322 of module connections 320, which consists of the remaining two module connections 320 which are likewise adjacent, is connected to the second connecting element 340 in an electrically conductive manner via the signal transmission medium 170.

The connecting elements 330, 340 transmit the field signals from the module connection board 301 to the field connection board 302. On the field connection board 302, the field signals are distributed to the field connections 360 using the signal lines 171 arranged there. Field-device-specific signal routing is carried out only on the field connection board 302. On the module connection board 301, all field signals from the first group 321 of module connections 320 are passed to the first connecting element 330 and all field signals from the second group 322 of module connections 320 are passed to the second connecting element 340. If a change to the signal routing is required when reconfiguring the third industrial control system 3, only the field connection board 302 needs to be replaced and the module connection board 301 can be left in the third industrial control system 3.

Figure 7:
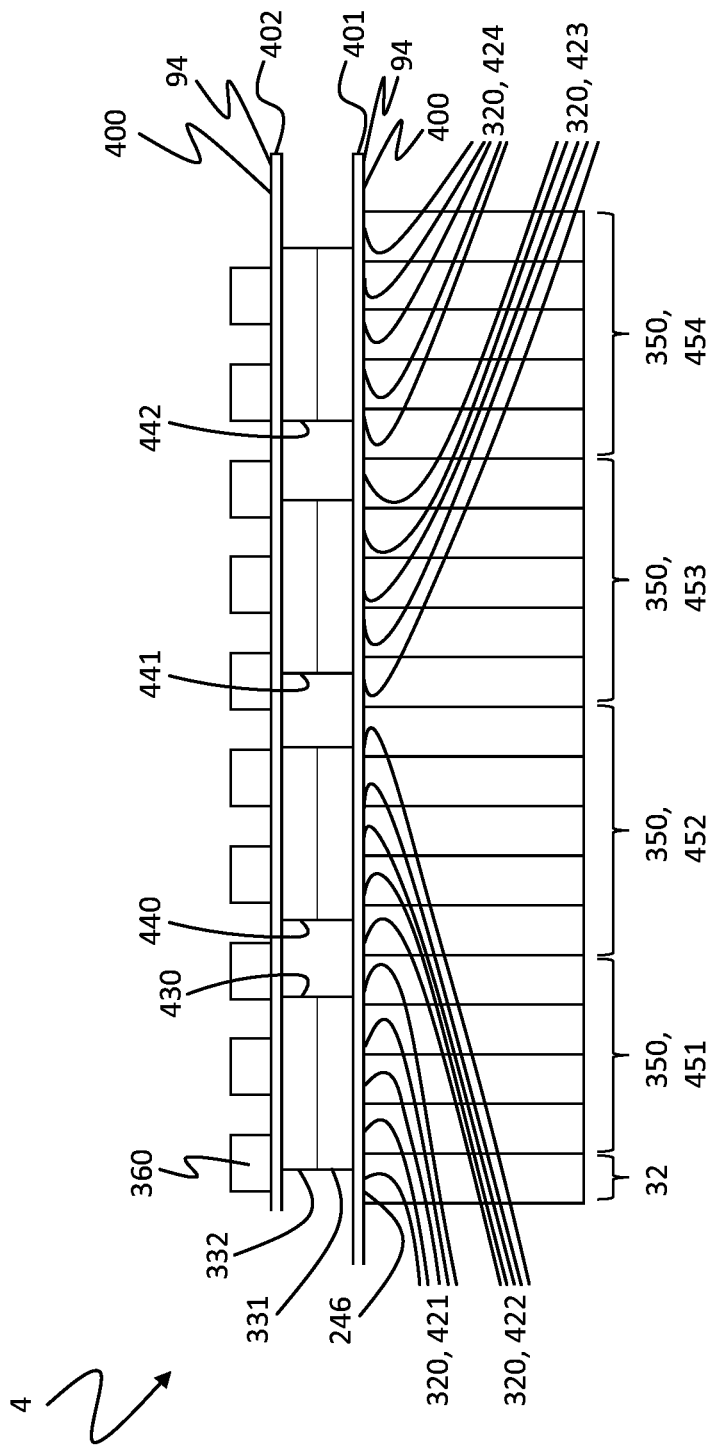
FIG. 7 shows a plan view of a fourth bus board of a fourth coupling unit of an industrial control system according to a fourth embodiment of the invention.

FIG. 7 shows a plan view of a fourth coupling unit 400 of a fourth industrial control system 4. If no differences are described, the fourth industrial control system 4 is designed in the same manner as the third industrial control system 3. The fourth coupling unit 400 comprises a fourth bus board 94. Like the third bus board 93, the fourth bus board 94 comprises a module connection board 401 and a field connection board 402. The module connection board 401 and the field connection board 402 are connected to one another in an electrically conductive manner using a first connecting element 430, a second connecting element 440, a third connecting element 441 and a fourth connecting element 442. If no differences are described, the connecting elements 430, 440, 441, 442 are designed in the same manner as the connecting elements 330, 340 of the third coupling unit 300. In particular, they each comprise the male connector 331 and the female connector 332.

A total of twenty of the module connections 320 are arranged on the module connection board 401. The field signal regions of the module connections 320 on the module connection board 401 are each connected to the connecting elements 430, 440, 441, 442 in an electrically conductive manner via the signal transmission medium of the fourth coupling unit 400. On the field connection board 402, the signal transmission medium of the fourth coupling unit 400 establishes electrically conductive contact between the connecting elements 430, 440, 441, 442 and a total of ten of the field connections 360.

The twenty module connections 320 form a first group 421, a second group 422, a third group 423 and a fourth group 424 of in each case five module connections 320 which are arranged in an adjacent manner. The contact elements of the field signal regions of the first group 421 of module connections 320 are connected to the first connecting element 430 in an electrically conductive manner. Accordingly, the field signal regions of the module connections 320 of the second group 422, of the third group 423 and of the fourth group 424 are respectively connected to the second connecting element 440, the third connecting element 441 and the fourth connecting element 442 in an electrically conductive manner. Like in the third coupling unit 300, field-device-specific signal routing is carried out on the field connection board 402.

The fourth industrial control system 4 comprises nineteen of the control modules 350 and the converter module 32. The control modules 350 and the converter module 32 are arranged in a row beside one another on the module connection board 401 and make contact with the module connections 320. The module connection 320, to which the converter module 32 placed at one end of the row is connected, forms the further converter module connection 246. The remaining four module connections 320 of the first number 421 of module connections 320 are each occupied by one of the control modules 350.

The four control modules 350 connected to the first number 421 of module connections 320 form a first group 451 of control modules 350, the field signals from which are transmitted to the field connections 360 via the first connecting element 430. In a similar manner, the five control modules 320 connected to the second number 422 of module connections 320 form a second group 452 of control modules 320, the field signals from which are transmitted to the field connections 360 via the second connecting element 440. The five control modules 350 connected to the third number 423 of module connections 320 form a third group 453 of control modules 320, and the five control modules 350 connected to the fourth number 424 of module connections 320 form a fourth group 454 of control modules 350. The field signals from the third group 453 of control modules 350 are transmitted to the field connections 360 via the third connecting element 441 and the field signals from the fourth group 454 of control modules 350 are transmitted to the field connections 360 via the fourth connecting element 442.

The field connection board 402 and the module connection board 401 are arranged parallel to one another, the field connection board 402 being arranged on a rear side of the fourth coupling unit 400 and the module connection board 401 being arranged on a front side of the fourth coupling unit 400. Field signal transmission media may therefore be connected on one side of the coupling unit 400 and the control modules 350 and the converter module 32 may be connected on the other side of the coupling unit 400.

Instead of forming each of the first, second, third and fourth numbers 421, 422, 423, 424 from five of the module connections 320, the field signals from a larger or smaller number of module connections 320 may also be combined on one of the connecting elements 330, 340, 341, 342. The field signals from a different number of module connections 320 may also be respectively combined on the different connecting elements 330, 340, 341, 342.

Figure 8:
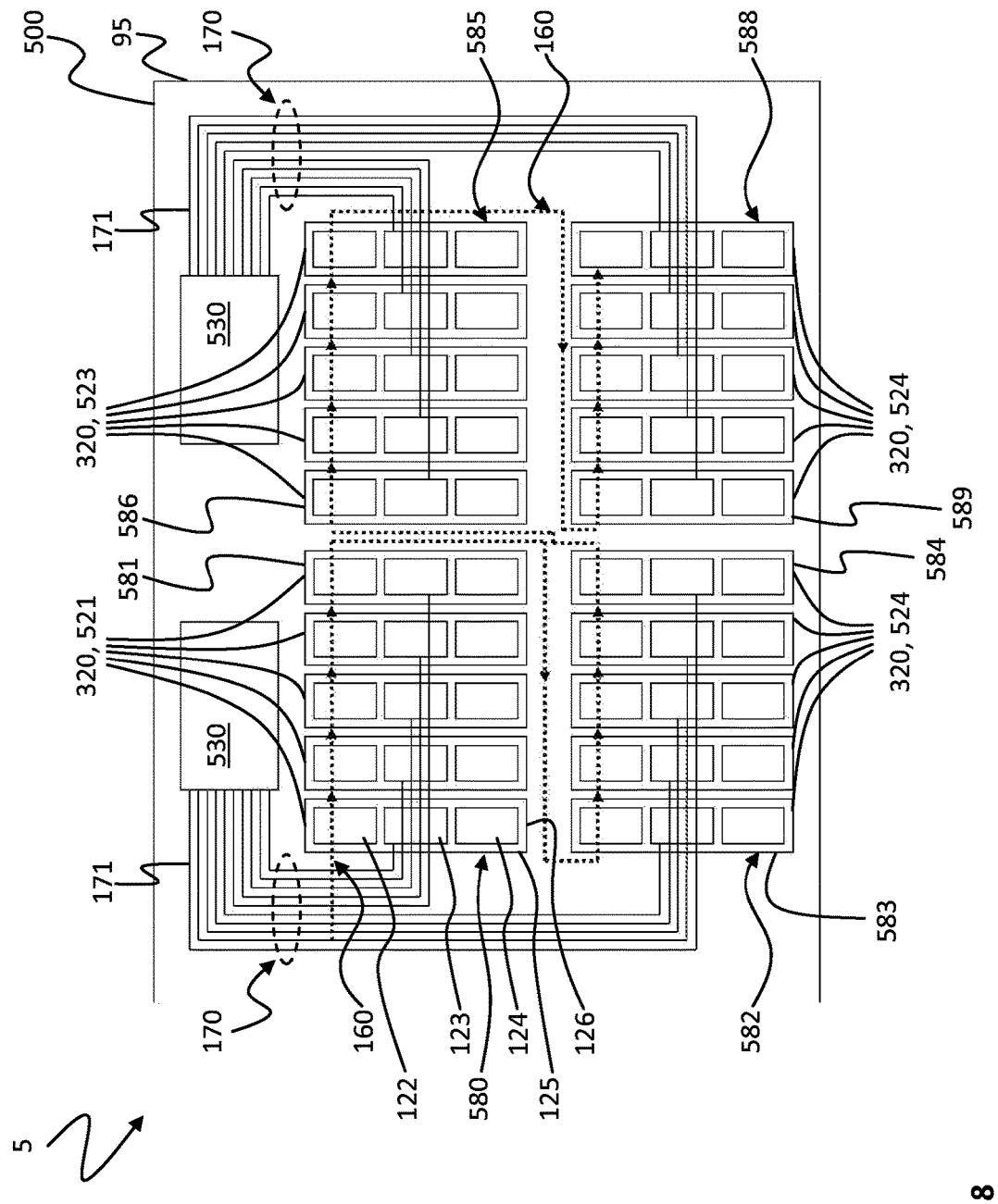
FIG. 8 shows a section of a fifth bus board of a fifth coupling unit of an industrial control system in a fifth embodiment of the invention.

The module connections 320 may also be arranged in a plurality of rows on the coupling unit. FIG. 8 illustrates a section of a fifth coupling unit 500 of a fifth industrial control system 5 having a fifth bus board 95. If no differences are described, the fifth industrial control system 5, the fifth coupling unit 500 and the fifth bus board 95 are designed in the same manner as the fourth control system 4, the fourth coupling unit 400 and the fourth bus board 94.

The module connections 320 are arranged in a plurality of rows above one another and beside one another on the fifth bus board 95. In this case, five of the module connections 320 respectively form a first number 521, a second number 522, a third number 523 and a fourth number 524 of module connections 320.

The first number 521 of module connections 320 is arranged in a first row 580, the second number 522 of module connections 320 is arranged in a second row 582, the third number 523 of module connections 320 is arranged in a third row 585 and the fourth number 524 of module connections 320 is arranged in a fourth row 588. In this case, the long sides 125 of the module connections 320 are each arranged parallel to one another and at a distance from one another. The short sides 126 of the module connections 320 of one of the rows 580, 582, 585, 588 are each aligned flush.

The first, second, third and fourth rows 580, 582, 585, 588 are each oriented parallel to one another. The second row 582 and the first row 580 of module connections 320 are arranged on the fifth bus board 95 in such a manner that one of each of the short sides 126 of the module connections 320 of the first and second rows 580, 582 face one another. In addition, the second row 582 of module connections 320 is arranged below the first row 580. The first row 580 is adjoined at a distance by the third row 585 and the second row 582 is adjoined by the fourth row 588. The fourth row 588 is therefore arranged below the third row 585.

Like in the first, second, third and fourth coupling units 100, 200, 300, 400, the module connections 320 are connected to one another via the data transmission medium 160 of the fifth coupling unit 500. In this case, the module connections 320 of the rows 580, 582, 585, 588 are each connected sequentially along the rows 580, 582, 585, 588, starting from a first module connection with which contact has been made, up to a last module connection with which contact has been made by means of the data transmission medium 160.

A last module connection 581 with which contact has been made in the first row 580 is arranged on that side of the first row 580 which is adjoined by the third row 585 of module connections 320 and a last module connection 584 with which contact has been made in the second row 582 is arranged below the last module connection 581 with which contact has been made in the first row 580. A first module connection 583 with which contact has been made in the second row 582 is situated on that side of the second row 582 which is opposite the last module connection 584 with which contact has been made in the second row 582. The last module connection 581 with which contact has been made in the first row 580 and the first module connection 583 with which contact has been made in the second row 582 are connected to one another in an electrically conductive manner via the data transmission medium 160.

In a similar manner to the first and second rows 580, 582, the module connections 320 of the third and fourth rows 585, 588 are connected to one another via the data transmission medium 160. A first module connection 586 with which contact has been made in the third row 585 is arranged on that side of the third row 585 which faces the first row 580. A last module connection 587 with which contact has been made in the third row 585 is on the opposite side of the third row 585. A first module connection 589 with which contact has been made in the fourth row 588 is below the first module connection 586 with which contact has been made in the third row 585. The communication signal region 122 of the last module connection 587 with which contact has been made in the third row 585 is connected to the communication signal region 122 of the first module connection 589 with which contact has been made in the fourth row 588 of module connections 320 via the data transmission medium 160.

Communication data transmitted on the data transmission medium 160 may first of all be transmitted to the module connections 320 of the first row 380, then to the module connections 320 of the second row 582, the module connections 320 of the third row 585 and finally to the module connections 320 of the fourth row 588. In this case, the communication data may pass through the module connections 320 of the individual rows 380, 382, 385, 388 in the same direction in each case.

The contact elements 110 of the field signal regions 123 of the module connections 320 of the first row 580 and of the second row 582 are each all connected to a first connecting element 530 via the signal transmission medium 170. The contact elements 110 of the field signal regions 123 of the module connections 320 of the third and fourth rows 585, 588 are connected to a second connecting element 540 via the signal transmission medium 170. Not all contact elements 110 of the field signal regions 123 need to be connected to one of the connecting elements 530, 540. If no differences are described, the first connecting element 530 and the second connecting element 540 of the fifth coupling unit 500 are designed in the same manner as the connecting elements 330, 340, 430, 440, 441, 442 of the third and fourth coupling units 300, 400. The first connecting element 530 is arranged on that side of the first row 580 of module connections 320 which is opposite the second row 582. In a similar manner, the second connecting element 540 is arranged on that side of the third row 585 of module connections 320 which is opposite the fourth row 588.

The fifth coupling unit 500 may comprise further rows of module connections 320 and connecting elements. For example, one or more connection blocks may be arranged on the fifth bus board 95, each of which comprises two rows of module connections 320 and a connecting element. The two rows of module connections 320 and the connecting element may be arranged on the fifth bus board 95, for example, in the same manner as the first and second rows 580, 582 of module connections 320 and the first connecting element 530 and in the same manner as the third and fourth rows 585, 588 and the second connecting element 540. The module connections 320 and the connecting element of a connection block are therefore arranged adjacent to one another. A regular repetition of these connection blocks easily makes it possible to extend a board layout with additional module connections 320 and connecting elements.

The rows 580, 582, 585, 588 may also comprise a smaller or larger number of module connections 320. The module connections 320 of only one or of more than two rows may also be connected to a connecting element for the field connection board 402 via the signal transmission medium 170.

Figure 9:
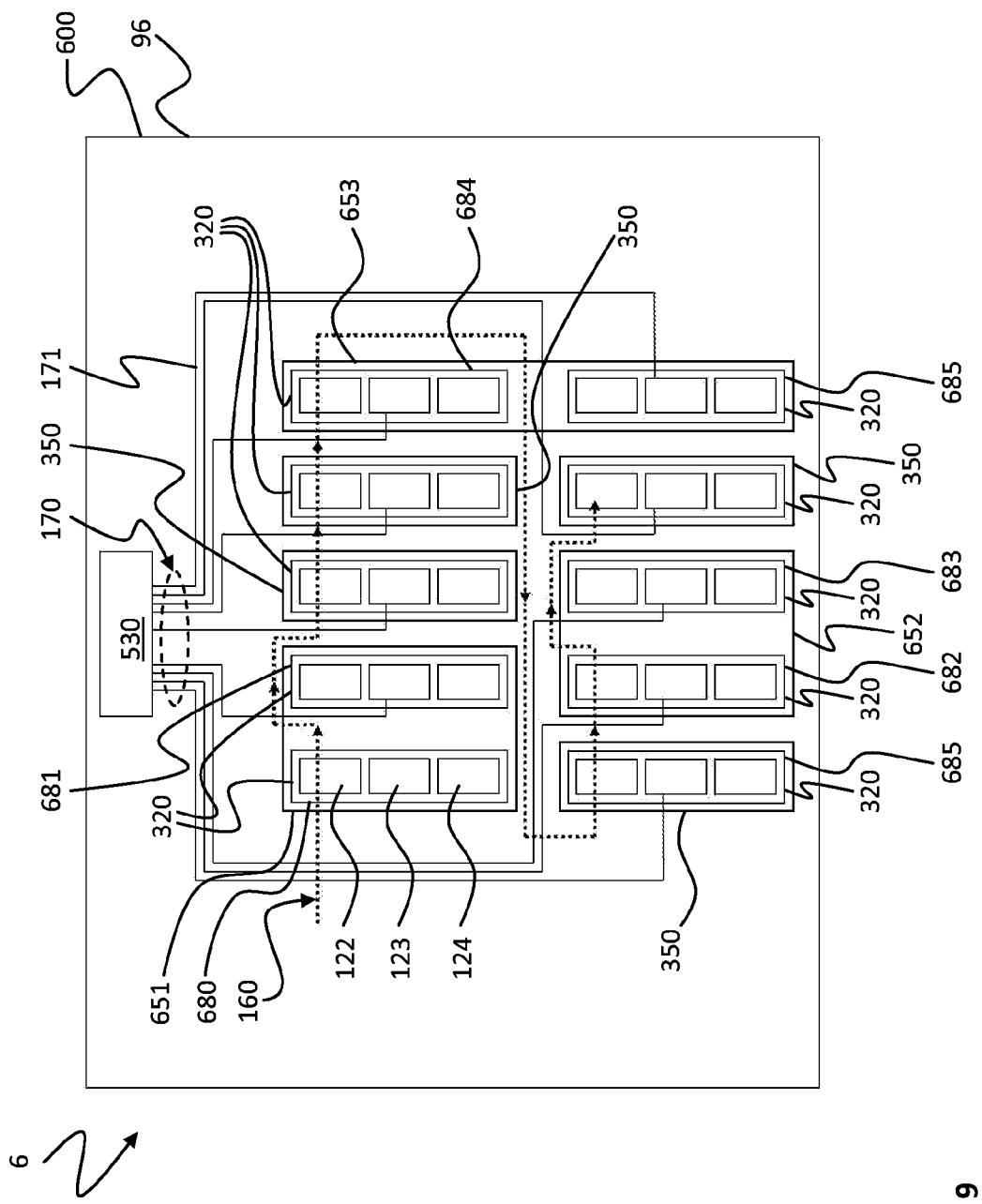
FIG. 9 shows an illustration of a sixth bus board of a sixth coupling unit of an industrial control system according to a sixth embodiment of the invention.

An industrial control system may also comprise control modules which make contact with more than one module connection. FIG. 9 shows a section of a sixth coupling unit 600 of a sixth industrial control system 6 having a sixth bus board 96. If no differences are described, the sixth industrial control system 6, the sixth coupling unit 600 and the sixth bus board 96 are designed in the same manner as the fifth control system 5, the fifth coupling unit 500 and the fifth bus board 95.

Ten of the module connections 320 are fitted to the sixth bus board 96 in two rows beside one another. The two rows are arranged above one another on the sixth bus board 96 of the sixth coupling module 600. One of the control modules 350 is respectively connected to four of the module connections 320. In addition to the control modules 350, the sixth industrial control system 6 comprises a wide control module 651. The wide control module 651 is designed in the same manner as the control modules 20, 22, 23, 350 of the first, second, third and fourth control systems 1, 2, 3, 4 but has twice the width of the latter and is designed to make contact with two module connections 320 instead of only one module connection 320.

On the sixth bus board 96, the wide control module 651 makes contact with a fifth module connection 680 and a sixth module connection 681 arranged in the same row beside the fifth module connection 680. The fifth and sixth module connections 680, 681 are designed and contacted in the same manner as the module connections 120, 130, 140, 145, 320 of the first, second, third and fourth coupling units 100, 200, 300, 400.

The wide control module 651 may make contact with the data transmission medium 160 via the fifth module connection 680 and may make contact with the signal transmission medium 170 via the sixth module connection 681. If more contact elements 110 than those included in the field signal region 123 of the sixth module connection 681 are needed to transmit the field signals, contact can be additionally made with the contact elements 110 of the field signal region 123 of the fifth module connection 680 for the purpose of transmitting field signals. This is the situation in the case of a further wide control module 652 which is arranged on the lower row of module connections 320 and makes contact with a seventh module connection 682 and an eighth module connection 683. The seventh and eighth module connections 680, 681 are designed and contacted in the same manner as the module connections 120, 130, 140, 145, 320 of the first, second, third and fourth coupling units 100, 200, 300, 400.

The wide control module 651 may be, for example, in the form of a motor connection module for controlling a motor or drive with a comparatively high current. In order to avoid overloading the module connections 680, 681, a plurality of contact elements 110 can be used in a parallel manner to transmit the drive current. Since the data transmission medium 160 does not make contact with the communication signal region 122 of the sixth module connection 681, it is guided around the contact elements 110 of the communication signal region 122 in the region of the sixth module connection 681.

The sixth industrial control system 6 also comprises a high control module 653. The high control module is designed in the same manner as the control modules 20, 22, 23, 350 of the first, second, third and fourth control systems 1, 2, 3, 4 but has approximately twice the height of the latter. The high control module 653 has two connection elements which are arranged above one another and are used by the control module to make electrically conductive contact with a ninth module connection 684 and a tenth module connection 685 of the sixth coupling unit 600. The ninth module connection 684 and the tenth module connection 685 are arranged above one another in one of the two rows of module connections 320 in each case and are designed in the same manner as the module connections 120, 130, 140, 145, 320 of the first, second, third and fourth coupling units 100, 200, 300, 400.

The high control module 652 makes contact with the data transmission medium 160 of the sixth coupling unit 600 via the ninth module connection 684. Alternatively, the high control module 653 can also make contact with the data transmission medium 160 via the tenth module connection 685 or via the ninth module connection 684 and the tenth module connection 685. The high control module 653 makes contact with the signal transmission medium 170 of the sixth coupling unit 600 via the field signal regions 123 of both the ninth module connection 684 and the tenth module connection 685. Depending on the configuration of the high control module 653 and the number of contact elements 110 needed to transmit the field signals, the high control module 653 can also make contact with the signal transmission medium 170 only via the ninth or tenth module connection 684, 685.

Figure 10:
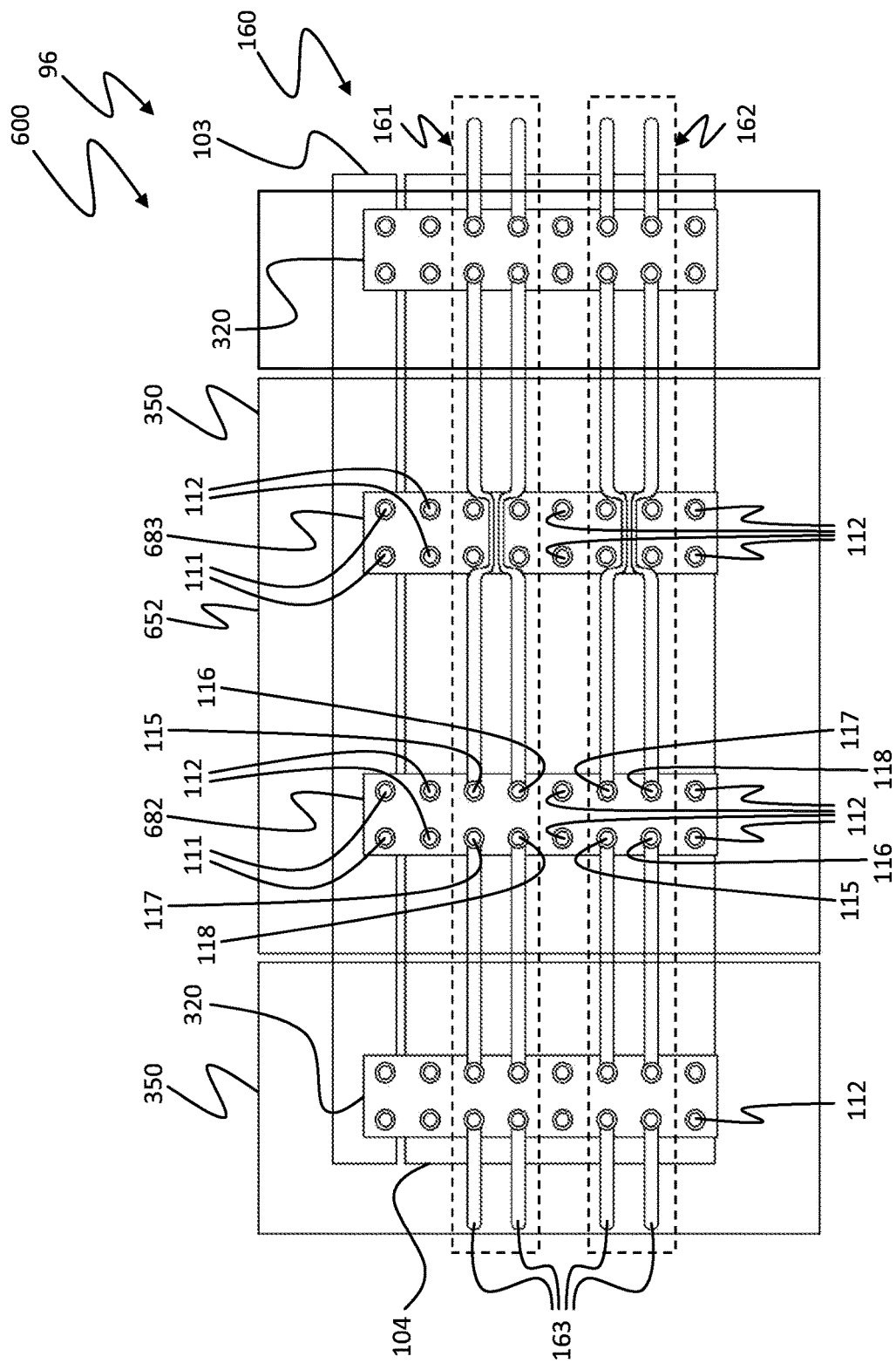
FIG. 10 shows an illustration of communication signal regions of four module connections of the sixth bus board.

FIG. 10 illustrates a section of the data transmission medium 160 of the sixth bus board 96 of the sixth coupling unit 600 in the region of the further wide control module 652 in more detail. As described in connection with the first bus board 91 of the first coupling unit 100, the data transmission medium 160 comprises the first and second data channels 161, 162. The data transmission medium 160 also comprises the bus voltage line 103 and the ground plane 104. Unless described otherwise, the module connections 320, 680, 681, 682, 683, 684, 685 make contact with the data transmission medium 160 as described in connection with FIG. 3. In contrast to FIG. 3, however, the data lines 163 of the data transmission medium 160 do not make contact with the sixth module connection 681, the eighth module connection 683 and the tenth module connection 685.

The seventh module connection 682, which is illustrated in FIG. 10 and to which one of the connection elements of the further wide control module 652 is connected, has transmitting contact elements 115, 116 and receiving contact elements 117, 118 like the first module connection 120 of the first bus board 91. In the same manner as that in which the first module connection 120 is connected to the fourth module connection 145 and to the second module connection 130, the transmitting contact elements 115, 116 and the receiving contact elements 117, 118 of the seventh module connection 682 are connected to the module connections 320 arranged beside the seventh module connection 682 and the eighth module connection 683.

The eighth module connection 683 is not used to transmit data. Therefore, the data lines 163 of the first and second data channels 161, 162 are guided through between the contact elements 110 of the eighth module connection 683 without making electrical contact with these contact elements 110. In this case, the data lines 163 are arranged between the contact elements 110 which act as a transmitting contact element 115 and a further transmitting contact element 116 and as a receiving contact element 117 and a further receiving contact element 118 in the case of module connections 320, 680, 682, 684 connected to the data transmission medium 160. The contact elements 110 of the eighth module connection 683 which have not been occupied can either not have contact made with them at all or can make contact with the ground plane 104. In a similar manner, the data lines 163 may be guided past the contact elements 110 of the sixth and tenth module connections 681, 685 without making contact therewith.

Figure 11:
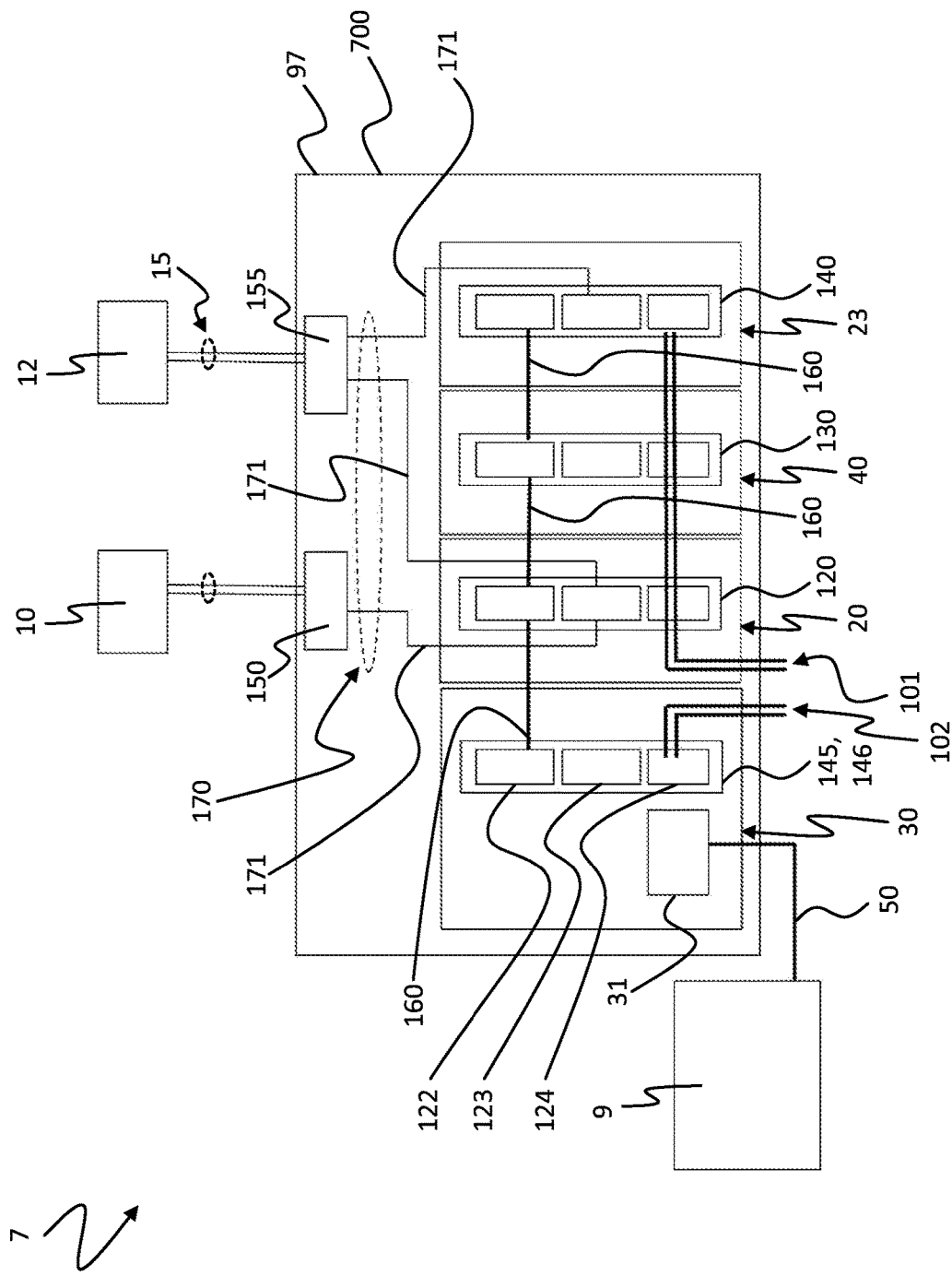
FIG. 11 shows an illustration of an industrial control system according to a seventh embodiment of the invention.

If the industrial control system comprises fewer control modules than there are available module connections on the coupling unit, placeholder modules can be arranged at the free module connections in order to make it possible to forward the communication data. FIG. 11 illustrates a seventh industrial control system 7 which comprises a seventh coupling unit 700 having a seventh bus board 97. If no differences are described, the seventh industrial control system 7, the seventh coupling unit 700 and the seventh bus board 97 are designed in the same manner as the first industrial control system 1, the first coupling unit 100 and the first bus board 91.

Instead of the second control module 22, a placeholder module 40 is arranged at the second module connection 120 of the seventh coupling unit 700. If no differences are described, the placeholder module 40 is designed in the same manner as the first, second and third control modules 20, 22, 23. Like these control modules 20, 22, 23, the placeholder module 40 is designed, in particular, to receive communication data from the first control module 20 or the third control module 23 via the data transmission medium 160 and to forward the communication data to the respective other control module of the control modules 20, 23. However, the placeholder module 40 is not designed to transmit field signals via the contact elements 110 of the field signal region 123 of the second module connection 130. It is also not designed to convert field signals which have been read in into communication data or field signals on the basis of processed communication data.

The placeholder module 40 ensures that communication data on the data transmission medium 160 interrupted in the region of the second module connection 130 can be transmitted from the first control module 20 to the third control module 23 and vice versa. For this purpose, the placeholder module 40 may be designed to amplify and/or smooth data signals received from the control modules 20, 23 before being forwarded in order to make it possible to transmit the communication data without errors.

The control computer 9 may be designed to query the number of module connections 120, 130, 140, 145 available on the seventh bus board 7 and the type of modules 20, 23, 30, 40 connected to these module connections 120, 130, 140, 145. This can be carried out, for example, during initialization of the seventh industrial control system 7. The number and type of occupation of the available module connections 120, 130, 140, 145 can be queried, for example, by virtue of the control computer 9 transmitting communication data to the control modules 20, 23 and to the placeholder module 40 via the converter module 31, into which data the modules 20, 23, 40 insert module-specific identifiers. The module-specific identifiers may indicate, for example, whether the modules are one of the control modules 20, 23 or the placeholder module 40. The control modules 20, 23 may additionally insert individual identifiers into the communication data in order to indicate, for example, whether they are an input or output module or a digital or analog module. Finally, it is also possible to use identifiers which uniquely identify each of the modules 20, 23, 30, 40, for example on the basis of a MAC address.

The communication data changed by the control modules 20, 23 and by the placeholder module 40 can then be transmitted back to the control computer 9. The control computer 9 can use the communication data to determine, for example, a number of module connections occupied by placeholder modules. When reconfiguring the seventh industrial control system 7, at most a number of additional control modules corresponding to this number can be installed in the seventh control system 7.

Figure 12:
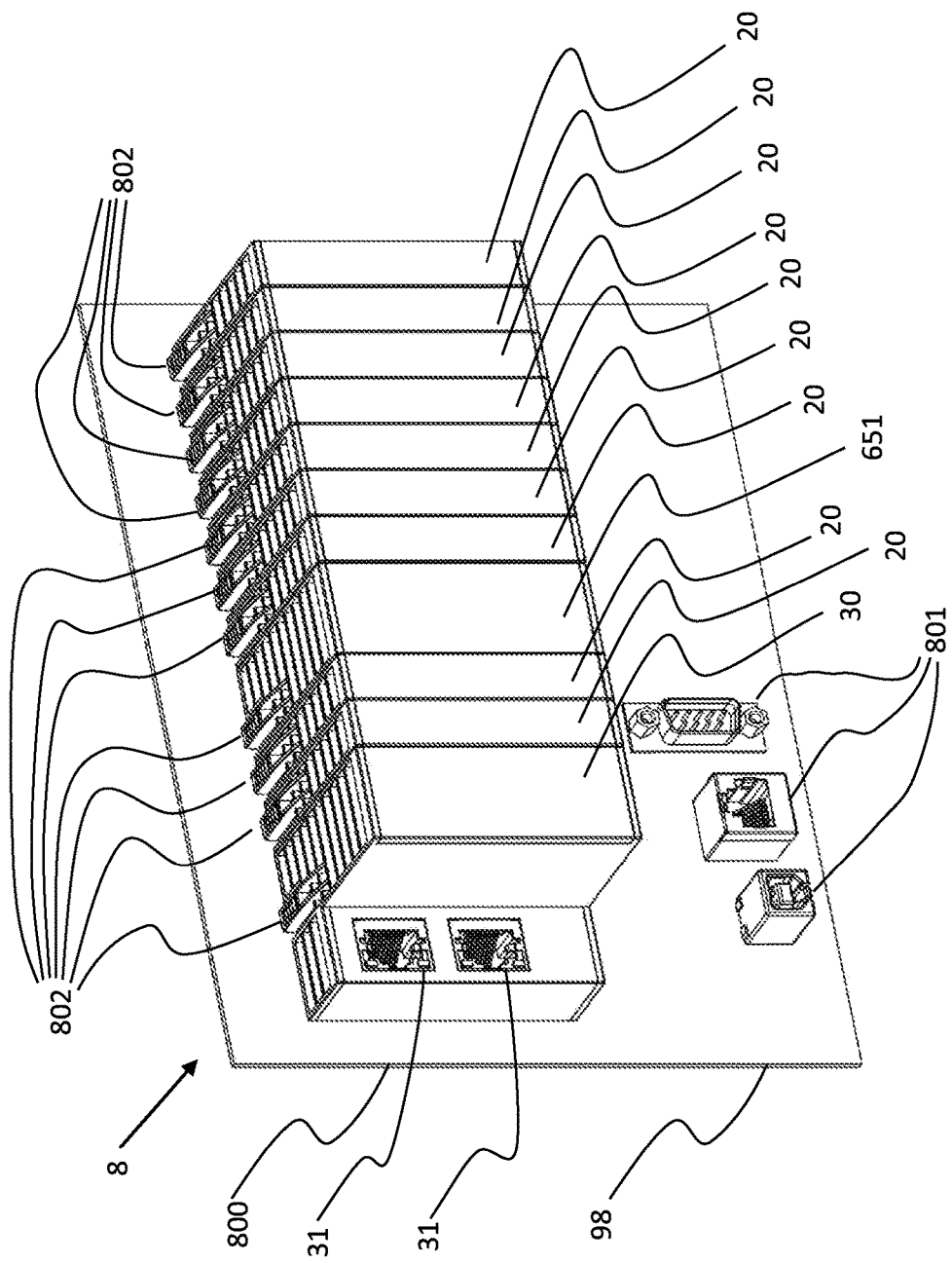
FIG. 12 shows a view of an eighth coupling unit of an industrial control system according to an eighth embodiment of the invention.

FIG. 12 shows an overall view of an eighth industrial control system 8 having an eighth coupling unit 800 and an eighth bus board 98. If not described differently, the eighth industrial control system 8, the eighth coupling unit 800 and the eighth bus board 98 are designed in the same manner as the first industrial control system 1, the first coupling unit 100 and the first bus board 91.

Nine of the first control modules 20 described in connection with the first industrial control system 1 and the wide control module 651 described in connection with the sixth industrial control system 6 are arranged on the eighth coupling unit 800. The eighth industrial control system 8 also comprises the first converter module 30 having the interface 31 which can be used to establish a connection to the superordinate data path 50. The interface 31 may comprise, for example, two network connections in the form of RJ-45 female connectors.

The control modules 20, 651 and the first converter module 30 are arranged in a manner adjoining one another and in a row on the bus board 98. In this case, the converter module 30 is placed at one end of the row. The control modules 20, 651 and the first converter module 30 are mechanically connected to the eighth bus board 98 via mechanical locking elements 802 in the form of latching lugs. The latching lugs are each arranged on two side surfaces of the modules 20, 651, 30, which side surfaces are oriented along the row and perpendicular to the eighth bus board 98, and engage in an anchoring manner in recesses in the eighth bus board 98. The anchoring can be released by exerting pressure on the latching lugs and by bending of the latching lugs which is caused by the pressure.

In addition, three additional electrical connecting elements 801 are arranged on the eighth bus board 98. The electrical connecting elements 801 enable a data connection between an external configuration computer and the eighth bus board 98. The electrical connecting elements 801 are in the form of a USB female connector, a network female connector and a serial D-sub female connector, but may also have another form factor suitable for a data connection. Components which are arranged on the eighth bus board 98 in addition to the modules 20, 651, 30, for instance voltage converters, can be configured, for example, using the configuration computer which can be connected to the connecting elements 801.

EXAMPLES

A coupling unit for an industrial control system has at least two module connections for making electrical contact with control modules, a field connection for making electrical contact with an industrial field device, a data transmission medium, and a signal transmission medium. Each of the two module connections comprises electrical contact elements which form a communication signal region and a field signal region. The contact elements of the communication signal regions of the two module connections are connected to one another in an electrically conductive manner via the data transmission medium, and the contact elements of the field signal regions of the two module connections are connected to the field connection via the signal transmission medium.

The control modules can interchange communication data with one another or with a control computer, for example, via the contact elements of the communication signal region and the data transmission medium. The control modules can interchange field signals with an industrial control device connected to the field connection, for example, via the contact elements of the field signal region and the signal transmission medium. By virtue of the fact that the module connections are used to transmit both communication data and field signals, it is possible to dispense with additional connections for transmitting the field signals, for example in the form of front spring loaded contacts on the control modules. This makes it possible to replace the control modules in an advantageously simple manner without having to detach the field-side signal wiring.

By virtue of the fact that the field signal regions of both module connections are connected to the field connection via the signal transmission medium of the coupling unit, field signals from both control modules can be advantageously combined on the field connection. This allows a field device or a group of field devices to be connected to the coupling unit in an advantageously simple manner via an individual field signal transmission medium. The field signal transmission medium may consist, for example, of a multicore cable or a cable harness. Signal routing is then carried out directly in the coupling unit and there is advantageously no need for any complicated and error-prone cross-wiring of the control modules connected to the module connections.

In one embodiment of the coupling unit, the coupling unit has a bus board, on which the module connections and the field connection are arranged, and which comprises the data transmission medium and the signal transmission medium. As a result, the signal transmission medium may be formed in an advantageously simple manner by means of conductor tracks arranged on or in the bus board. As a result, signal routing directly on the coupling unit is possible in a simple and cost-effective manner.

In one embodiment of the coupling unit, the coupling unit has a further field connection for making electrical contact with a further industrial field device, contact elements of the field signal region of at least one of the two module connections being connected to the further field connection in an electrically conductive manner via the signal transmission medium. This makes it possible in an advantageously simple manner to connect a further industrial field device to the coupling unit via the further field connection. By virtue of the fact that one module connection is connected to both field connections, field devices at both field connections can advantageously communicate with a control module connected to the module connection.

In one embodiment of the coupling unit, the communication signal region and the field signal region of the two module connections each consist of contact elements arranged in an adjacent manner. This makes it possible to implement in an advantageously simple manner a module connection which is used to transmit both communication data and field signals. The signal regions can be advantageously electrically decoupled from one another by virtue of an adjacent arrangement of the contact elements of the individual signal regions. This makes it possible to prevent crosstalk of communication signals to the field signal region and the signal transmission medium or crosstalk of field signals to the data transmission medium.

In one embodiment of the coupling unit, the communication signal region of the two module connections respectively comprises a receiving contact element and a transmitting contact element. The transmitting contact element of a first module connection is connected to the receiving contact element of a second module connection in an electrically conductive manner via the data transmission medium, and the transmitting contact element of the second module connection is connected to the receiving contact element of the first module connection in an electrically conductive manner via the data transmission medium. This makes it possible to implement in an advantageously simple manner a direct electrical point-to-point connection between the communication signal regions of the module connections, as is needed to form a data network in a line topology, for example.

In one embodiment of the coupling unit, the data transmission medium comprises a first data channel and a second data channel. A first number of contact elements of the communication signal region of the two module connections is connected to the first data channel in an electrically conductive manner, and a second number of contact elements of the communication signal region of the two module connections is connected to the second data channel in an electrically conductive manner. This makes it possible to implement a data transmission medium which advantageously allows transmission of communication data between the module connections on both sides.

In one embodiment of the coupling unit, the data transmission medium is interrupted in the communication signal region of each module connection. This advantageously makes it possible to use the data transmission medium of the coupling unit to implement a field bus system in a line topology in which the transmitted communication data pass through the control modules connected to the module connections in succession.

In one embodiment of the coupling unit, at least one of the two module connections has electrical contact elements which form a voltage supply region and are connected to a field voltage supply of the coupling unit in a conductive manner. This makes it possible to supply voltage to all control modules connected to the module connections in an advantageously simple manner via a central field voltage supply running on the coupling unit.

In one embodiment of the coupling unit, the contact elements of the field signal region are arranged between the contact elements of the communication signal region and the contact elements of the voltage supply region. This makes it possible to arrange the contact elements of the individual regions of the module connection adjacent to one another, and crosstalk of signals from one of the regions to contact elements of the other regions is advantageously prevented.

In one embodiment of the coupling unit, the coupling unit has further module connections. The module connections have a substantially rectangular form with a long side and a short side, the long sides of the module connections being arranged substantially parallel to one another. A first number of module connections is arranged at a distance from one another in a first row, the contact elements of the communication signal regions of the first number of module connections being sequentially connected to one another along the first row in an electrically conductive manner via the data transmission medium. A second number of module connections is arranged at a distance from one another in a second row, the contact elements of the communication signal regions of the second number of module connections being sequentially connected to one another along the second row in an electrically conductive manner via the data transmission medium. The second row is arranged below the first row and parallel to the first row, the contact elements of the communication signal region of a last module connection with which contact has been made in the first row being connected to the contact elements of the communication signal region of a first module connection with which contact has been made in the second row in an electrically conductive manner via the data transmission medium.

This enables advantageously simple signal routing via the data transmission medium, during which the communication data, for example, first of all pass through the control modules which are connected to the module connections in the first row and then pass through the control modules which are connected to the module connections in the second row. The coupling unit can be implemented in an advantageously compact design as a result of the module connections being arranged in two rows and adjacent to one another.

In one embodiment of the coupling unit, a third number of module connections is arranged at a distance from one another in a third row, the third row being arranged in a manner adjoining the first row. The contact elements of the communication signal regions of the third number of module connections are sequentially connected to one another along the third row in an electrically conductive manner via the data transmission medium, and the contact elements of the communication signal region of a last module connection with which contact has been made in the second row are connected to the contact elements of the communication signal region of a first module connection with which contact has been made in the third row in an electrically conductive manner via the data transmission medium.

This advantageously makes it possible to connect the module connections to one another in blocks via the data transmission medium. In this case, communication data transmitted via the data transmission medium first of all pass through the control modules connected to the module connections in the first and second rows before they are forwarded to the control modules connected to the third row of module connections. For example, a further row of module connections can be arranged below the third row of module connections and contact can be made with said row after the third row via the data transmission medium. The first and second rows may then form a first block of module connections which is arranged beside a second block consisting of the third and fourth rows of module connections.

In one embodiment of the coupling unit, the coupling unit comprises a module connection board with the module connections and a field connection board with the field connection, and the module connection board and the field connection board are connected in an electrically conductive manner via a connecting element. Field-device-specific signal routing of the field signals output via the module connections can be carried out, for example, on the field connection board having the field connection. If the signal routing and the configuration of the control modules used are changed, only the field connection board then advantageously needs to be replaced. The connecting element may be in the form of a plug-in connection, for example, which makes it possible to replace the field connection board in an advantageously simple manner.

In one embodiment of the coupling unit, the module connection board and the field connection board are connected to one another in an electrically conductive manner via a further connecting element. In this case, the contact elements of the field signal regions of a first group of module connections are connected to the connecting element in an electrically conductive manner, and the contact elements of the field signal regions of a second group of module connections are connected to the further connecting element in an electrically conductive manner. This makes it possible to implement standardized field signal transmission from the module connections of the module connection board to the field connection board in an advantageously simple manner. One of the groups of module connections and a connecting element connected to the latter can form a connection block and the coupling unit can be extended with additional module connections by adding a further such connection block.

An industrial control system comprises the coupling unit which also has a converter module connection, a control module, and a converter module. The control module is designed to make electrically conductive contact with contact elements of one of the module connections in order to transmit communication data via contact elements of the communication signal region of the module connection and to transmit field signals via contact elements of the field signal region of the module connection. The converter module is designed to make electrically conductive contact with contact elements of the converter module connection and has an interface to a superordinate data path. The converter module is also designed to transmit communication data between the interface to the superordinate data path and contact elements of a communication signal region of the converter module connection.

Such a control system advantageously enables simple signal routing directly on the coupling unit. A further control module, for example, can be connected to the second module connection of the coupling unit of the industrial control system. Field signals from both control modules can be combined on the field connection of the coupling unit via the field signal regions of the module connections and the signal transmission medium. An industrial field device can then be directly connected to the field connection of the coupling unit in an advantageously simple manner.

The data transmission medium of the coupling unit can be connected to the superordinate data path via the converter module. This advantageously makes it possible to use different physical layer transmission technologies for the superordinate data path and the data transmission medium. For example, a technology which is suitable for wired transmission can be used for the superordinate data path, whereas a technology which enables particularly fast data transmission and is based on LVDS, for example, can be used for the data transmission medium.

In one embodiment of the control system, the converter module, the control module and the data transmission medium are designed to transmit the communication data using E-bus data messages. This makes it possible to transmit communication data via the data transmission medium in an advantageously rapid manner.

In one embodiment of the control system, the converter module is designed to transmit the communication data using Ethernet data messages, in particular using EtherCAT data messages, via the superordinate data path. This makes it possible to incorporate the industrial control system in a superordinate field bus system in an advantageously simple and cost-effective manner.

In one embodiment of the control system, a part of the superordinate data path is arranged on the coupling unit, the superordinate data path making electrically conductive contact with contact elements of the converter module connection. Therefore, contact can be advantageously fully made with the converter module via the converter module connection and it is possible to dispense with an additional connecting element to the superordinate data path, for example a network female connector.

In one embodiment of the control system, the industrial control system comprises a control computer and a placeholder module which is designed to make electrically conductive contact with contact elements of one of the module connections in order to interchange communication data with the converter module via the contact elements of the communication signal region of the module connection. The control computer is designed to interchange communication data with the control module and the placeholder module via the superordinate data path, the converter module and the data transmission medium in order to query a number of module connections of the coupling unit. The control computer is also designed to determine the number of module connections from communication data received from the control module and the placeholder module after the query.

The placeholder module may make contact only with contact elements of the communication signal region of the module connection, for example, and may not have any devices for generating and transmitting field signals. As a result, the placeholder module can be produced in an advantageously simple and cost-effective manner. The placeholder module may make contact, for example, with a module connection which is not intended to be occupied by a control module when configuring the industrial control system. If a field bus system in a line topology is implemented via the data transmission medium, the placeholder module can forward communication signals, which represent communication data received from the control computer, to a control module subsequently connected to the field bus system.

In addition, the placeholder module can advantageously amplify the communication signals before the latter are forwarded in order to avoid a loss of communication data as a result of attenuation of the communication signals on the data transmission medium. In the event of a system query, the control computer can use the received communication data to determine that one of the module connections is occupied by a placeholder module which could be replaced with a control module, for example, in another configuration. In this respect, the number of module connections queried by the control computer may be given, for example, by the number of module connections occupied by placeholder modules.

With the control system, machine manufacturers can be provided with corresponding coupling units for a large number of identical or very similar machines in series production, which coupling units are fitted with identical control modules in a fast, simple and error-resistant manner in an always identical way. The coupling unit functions virtually as a type of routing level (distribution board) and therefore replaces the manual routing with individual wires. This produces fewer errors and faster construction of the control system when producing the machines in series production. Non-variable parts which are frequently reused across machines produced in different series may be in the form of pluggable modules. In the event of minor deviations from the series and/or an extended range of functions of the control system, other modules which provide the desired range of functions can be easily connected to the coupling unit instead of the modules used in the series. Alternatively or additionally, slots for larger expansions of a machine controller can be reserved by means of placeholder modules. However, the additional possibility of combination with a control system known from the prior art in order to allow modular expansions of the machine and therefore to implement application-specific elements of the control system naturally still exists. Different signal waveforms from different control modules can be combined, in an application-specific manner, on an external connection or field connection for each coupling unit and therefore make it possible to connect a coupling unit to a single preassembled cable harness.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

Enumerated Examples And Embodiments

Embodiment 1. A coupling unit (100, 200, 300, 400, 500, 600, 700, 800) for an industrial control system (1, 2, 3, 4, 5, 6, 7, 8), having
- at least two module connections (120, 130, 140, 145, 320, 680, 681, 682, 683, 684, 685) for making electrical contact with control modules (20, 22, 23, 350, 651, 652, 653),
- at least one field connection (150, 360) for making electrical contact with at least one industrial field device (10),
- at least one data transmission medium (160), and
- at least one signal transmission medium (170),
- each of the at least two module connections (120, 130, 140, 145, 320, 680, 681, 682, 683, 684, 685) comprising electrical contact elements (110) which form at least one communication signal region (122) and at least one field signal region (123),
- contact elements (110) of the communication signal regions (122) of the at least two module connections (120, 130, 140, 145, 320, 420, 520, 620) being connected to one another in an electrically conductive manner via the at least one data transmission medium (160), and
- contact elements (110) of the field signal regions (123) of the at least two module connections (120, 130, 140, 145, 320, 680, 681, 682, 683, 684, 685) being connected to the at least one field connection (150, 360) via the at least one signal transmission medium (170).

Embodiment 2. The coupling unit (100, 200, 300, 400, 500, 600, 700, 800) of embodiment 1,
- having at least one bus board (91, 92, 93, 94, 95, 96, 97, 98), on which the at least two module connections (120, 130, 140, 145, 320, 680, 681, 682, 683, 684, 685) and the at least one field connection (150, 360) are arranged, and
- which comprises the at least one data transmission medium (160) and the at least one signal transmission medium (170).

Embodiment 3. The coupling unit (100, 200, 300, 400, 500, 600, 700, 800) as claimed in one of the preceding embodiments,
- having at least one further field connection (155) for making electrical contact with at least one further industrial field device (12),
- contact elements (110) of the at least one field signal region (123) of at least one of the at least two module connections (120, 130, 140, 145, 320, 680, 681, 682, 683, 684, 685) being connected to the at least one further field connection (155) in an electrically conductive manner via the at least one signal transmission medium (170).

Embodiment 4. The coupling unit (100, 200, 300, 400, 500, 600, 700, 800) of one of the preceding embodiment,
- the at least one communication signal region (122) and the at least one field signal region (123) of the at least two module connections (120, 130, 140, 145, 320, 680, 681, 682, 683, 684, 685) each consisting of contact elements (110) arranged in an adjacent manner.

Embodiment 5. The coupling unit (100, 200, 300, 400, 500, 600, 700, 800) of one of the preceding embodiment,
- the at least one communication signal region (122) of the at least two module connections (120, 130, 140, 145, 320, 420, 520, 620) respectively comprising at least one receiving contact element (117, 118) and at least one transmitting contact element (115, 116), and
- the at least one transmitting contact element (115, 116) of a first module connection (120, 130, 140, 145, 320, 680, 681, 682, 683, 684, 685) being connected to the at least one receiving contact element (117, 118) of a second module connection (120, 130, 140, 145, 320, 680, 681, 682, 683, 684, 685) in an electrically conductive manner via the at least one data transmission medium (160), and the at least one transmitting contact element (115, 116) of the second module connection (120, 130, 140, 145, 320, 680, 681, 682, 683, 684, 685) being connected to the at least one receiving contact element (117, 118) of the first module connection (120,

130, 140, 145, 320, 680, 681, 682, 683, 684, 685) in an electrically conductive manner via the at least one data transmission medium (160).

Embodiment 6. The coupling unit (100, 200, 300, 400, 500, 600, 700, 800) of one of the preceding embodiment,
the at least one data transmission medium (160) comprising at least one first data channel (161) and at least one second data channel (162), and
a first number (165) of contact elements (110) of the at least one communication signal region (122) of the at least two module connections (120, 130, 140, 145, 320, 680, 681, 682, 683, 684, 685) being connected to the at least one first data channel (161) in an electrically conductive manner, and a second number (166) of contact elements (110) of the at least one communication signal region (122) of the at least two module connections (120, 130, 140, 145, 320, 680, 681, 682, 683, 684, 685) being connected to the at least one second data channel (162) in an electrically conductive manner.

Embodiment 7. The coupling unit (100, 200, 300, 400, 500, 600, 700, 800) of one of the preceding embodiment,
the at least one data transmission medium (160) being interrupted in the at least one communication signal region (122) of each module connection (120, 130, 140, 145, 320, 680, 681, 682, 683, 684, 685).

Embodiment 8. The coupling unit (100, 200, 300, 400, 500, 600, 700, 800) of one of the preceding embodiment,
at least one of the at least two module connections (120, 130, 140, 145, 320, 680, 681, 682, 683, 684, 685) having electrical contact elements (110) which form at least one voltage supply region (124) and are connected to at least one field voltage supply (101) of the coupling unit (100, 200, 300, 400, 500, 600, 700, 800) in a conductive manner.

Embodiment 9. The coupling unit (100, 200, 300, 400, 500, 600, 700, 800) of embodiment 8,
the contact elements (110) of the at least one field signal region (123) being arranged between the contact elements (110) of the at least one communication signal region (122) and the contact elements (110) of the at least one voltage supply region (124).

Embodiment 10. The coupling unit (100, 200, 300, 400, 500, 600, 700, 800) of one of the preceding embodiment,
having further module connections (120, 130, 140, 145, 320, 680, 681, 682, 683, 684, 685),
the module connections (120, 130, 140, 145, 320, 680, 681, 682, 683, 684, 685) having a substantially rectangular form with a long side (525) and a short side (526),
the long sides (525) of the module connections (120, 130, 140, 145, 320, 680, 681, 682, 683, 684, 685) being arranged substantially parallel to one another,
a first number (521) of module connections (120, 130, 140, 145, 320, 680, 681, 682, 683, 684, 685) being arranged at a distance from one another in a first row (580),
the contact elements (110) of the communication signal regions (122) of the first number (521) of module connections (120, 130, 140, 145, 320, 680, 681, 682, 683, 684, 685) being sequentially connected to one another along the first row (580) in an electrically conductive manner via the at least one data transmission medium (160),
a second number (522) of module connections (120, 130, 140, 145, 320, 680, 681, 682, 683, 684, 685) being arranged at a distance from one another in a second row (582),
the contact elements (110) of the communication signal regions (122) of the second number (522) of module connections (120, 130, 140, 145, 320, 680, 681, 682, 683, 684, 685) being sequentially connected to one another along the second row (582) in an electrically conductive manner via the at least one data transmission medium (160),
the second row (582) being arranged below the first row (580) and parallel to the first row (580),
the contact elements (110) of the at least one communication signal region (122) of a last module connection (581) with which contact has been made in the first row (580) being connected to the contact elements (110) of the at least one communication signal region (122) of a first module connection (583) with which contact has been made in the second row (582) in an electrically conductive manner via the at least one data transmission medium (160).

Embodiment 11. The coupling unit (100, 200, 300, 400, 500, 600, 700, 800) of embodiment 10,
a third number (523) of module connections (120, 130, 140, 145, 320, 680, 681, 682, 683, 684, 685) being arranged at a distance from one another in a third row (585),
the third row (585) being arranged parallel to the first row (580) and in a manner adjoining the first row (580),
the contact elements (110) of the communication signal regions (122) of the third number (523) of module connections (120, 130, 140, 145, 320, 680, 681, 682, 683, 684, 685) being sequentially along the third row (585) connected to one another in an electrically conductive manner via the at least one data transmission medium (160),
the contact elements (110) of the at least one communication signal regions (122) of a last module connection (584) with which contact has been made in the second row (582) being connected to the contact elements (110) of the at least one communication signal region (122) of a first module connection (586) with which contact has been made in the third row (587) in an electrically conductive manner via the at least one data transmission medium (160).

Embodiment 12. The coupling unit (100, 200, 300, 400, 500, 600, 700, 800) of one of the preceding embodiment,
comprising at least one module connection board (301, 401) with the module connections (120, 130, 140, 145, 320, 680, 681, 682, 683, 684, 685) and comprising at least one field connection board (302, 402) with the at least one field connection (150, 360),
the at least one module connection board (301, 401) and the at least one field connection board (302, 402) being connected in an electrically conductive manner via at least one connecting element (330, 430, 530).

Embodiment 13. The coupling unit (100, 200, 300, 400, 500, 600, 700, 800) of embodiment 12,
the at least one module connection board (301, 401) and the at least one field connection board (302, 402) being connected to one another in an electrically conductive manner via at least one further connecting element (340, 440, 540),
the contact elements (110) of the field signal regions (122) of a first group (321, 421, 422) of module connections (120, 130, 140, 145, 320, 680, 681, 682, 683, 684, 685)

being connected to the at least one connecting element (330, 430, 530) in an electrically conductive manner, and the contact elements (110) of the field signal regions (122) of a second group (322, 423, 424) of module connections (120, 130, 140, 145, 320, 680, 681, 682, 683, 684, 685) being connected to the at least one further connecting element (340, 440, 540) in an electrically conductive manner.

Embodiment 14. An industrial control system (1, 2, 3, 4, 5, 6, 7, 8)

having a coupling unit (100, 200, 300, 400, 500, 600, 700, 800) of one of the embodiments 1 to 13 which has at least one converter module connection (146, 246), at least one control module (20, 22, 23, 350, 651, 652, 653), and at least one converter module (30, 32), the at least one control module (20, 22, 23, 350, 651, 652, 653) being designed to make electrically conductive contact with contact elements (110) of one of the module connections (120, 130, 140, 145, 320, 680, 681, 682, 683, 684, 685) in order to transmit communication data via contact elements (110) of the at least one communication signal region (122) of the at least one module connection (120, 130, 140, 145, 320, 680, 681, 682, 683, 684, 685) and to transmit field signals via contact elements (110) of the at least one field signal region (123) of the at least one module connection (120, 130, 140, 145, 320, 680, 681, 682, 683, 684, 685), the at least one converter module (30, 32) being designed to make electrically conductive contact with contact elements (110) of the at least one converter module connection (146, 246), the at least one converter module (30, 32) having at least one interface (31, 33) to at least one superordinate data path (50), the at least one converter module (30, 32) being designed to transmit communication data between the at least one interface (31, 33) to the at least one superordinate data path (50) and contact elements (110) of at least one communication signal region (122) of the at least one converter module connection (146, 246).

Embodiment 15. The industrial control system (1, 2, 3, 4, 5, 6, 7, 8) of embodiment 14, the at least one converter module (30, 32), the at least one control module (20, 22, 23, 350, 651, 652, 653) and the at least one data transmission medium (160) being designed to transmit the communication data using E-bus data messages.

Embodiment 16. The industrial control system (1, 2, 3, 4, 5, 6, 7, 8) of embodiment 14 or 15, the at least one converter module (30, 32) being designed to transmit the communication data using Ethernet data messages, in particular using EtherCAT data messages, via the at least one superordinate data path (50).

Embodiment 17. The industrial control system (1, 2, 3, 4, 5, 6, 7, 8) of one of the embodiments 14 to 16, a part of the at least one superordinate data path (50) being arranged on the coupling unit (100, 200, 300, 400, 500, 600, 700, 800), the at least one superordinate data path (50) making electrically conductive contact with contact elements (110) of the at least one converter module connection (146, 246).

Embodiment 18. The industrial control system (1, 2, 3, 4, 5, 6, 7, 8) of one of the embodiments 14 to 17, having at least one control computer (9), and having at least one placeholder module (40) which is designed to make electrically conductive contact with contact elements (110) of one of the module connections (120, 130, 140, 145, 320, 680, 681, 682, 683, 684, 685) in order to interchange communication data with the at least one converter module (30, 32) via the contact elements (110) of the at least one communication signal region (122) of the module connection (120, 130, 140, 145, 320, 680, 681, 682, 683, 684, 685), the at least one control computer (9) being designed to interchange communication data with the at least one control module (20, 22, 23, 350, 651, 652, 653) and the at least one placeholder module (40) via the at least one superordinate data path (50), the at least one converter module (30, 32) and the at least one data transmission medium (160) in order to query a number of module connections (120, 130, 140, 145, 320, 680, 681, 682, 683, 684, 685) of the coupling unit (100, 200, 300, 400, 500, 600, 700, 800), the at least one control computer (9) being designed to determine the number of module connections (120, 130, 140, 145, 320, 680, 681, 682, 683, 684, 685) from communication data received from the at least one control module (20, 22, 23, 350, 651, 652, 653) and the at least one placeholder module (40) after the query.

LIST OF REFERENCE SYMBOLS 1 first industrial control system
2 second industrial control system
3 third industrial control system
4 fourth industrial control system
5 fifth industrial control system
6 sixth industrial control system
7 seventh industrial control system
8 eighth industrial control system
9 control computer
10 industrial field device
12 further industrial field device
15 field signal transmission medium
17 field signal line
20 first control module
22 second control module
23 third control module
30 first converter module
31 interface of the first converter module
32 second converter module
33 interface of the second converter module
40 placeholder module
50 superordinate data path
91 first bus board
92 second bus board
93 third bus board
94 fourth bus board
95 fifth bus board
96 sixth bus board
97 seventh bus board
98 eighth bus board
100 first coupling unit
101 field voltage supply
102 bus-side voltage supply
103 bus voltage line
104 ground plane of the data transmission medium
105 bus conductor region
106 field conductor region
107 distance
110 electrical contact elements 111 voltage contact element
112 ground contact element
115 transmitting contact element
116 further transmitting contact element
117 receiving contact element
118 further receiving contact element
120 first module connection
122 communication signal region
123 field signal region
124 voltage supply region
125 long side
126 short side
130 second module connection
140 third module connection
145 fourth module connection
146 converter module connection
150 field connection
155 further field connection
160 data transmission medium
161 first data channel
162 second data channel
163 data line
165 first number of contact elements
166 second number of contact elements
170 signal transmission medium
171 signal lines
200 second coupling unit
201 coupling device of the superordinate data path
246 further converter module connection
300 third coupling unit
301 module connection board
302 field connection board
305 field signal transmission medium
320 module connection
321 first group of module connections
322 second group of module connections
330 first connecting element
340 second connecting element
350 control module
360 field connection
400 fourth coupling unit
401 module connection board
402 field connection board
421 first number of module connections
422 second number of module connections
423 third number of module connections
424 fourth number of module connections
430 first connecting element
440 second connecting element
441 third connecting element
442 fourth connecting element
451 first group of control modules
452 second group of control modules
453 third group of control modules
454 fourth group of control modules
500 fifth coupling unit
521 first number of module connections
522 second number of module connections
523 third number of module connections
524 fourth number of module connections
530 first connecting element
540 second connecting element
580 first row
581 last module connection with which contact has been made in the first row
582 second row
583 first module connection with which contact has been made in the second row
584 last module connection with which contact has been made in the second row
585 third row
586 first module connection with which contact has been made in the third row
587 last module connection with which contact has been made in the third row
588 fourth row
589 first module connection with which contact has been made in the fourth row
600 sixth coupling unit
651 wide control module
652 further wide control module
653 high control module
680 fifth module connection
681 sixth module connection
682 seventh module connection
683 eighth module connection
684 ninth module connection
685 tenth module connection
700 seventh coupling unit
800 eighth coupling unit
801 connecting elements
802 locking elements

What is claimed is:

1. A coupling unit for an industrial control system, having
a first module connection for making electrical contact with a first control module,
a second module connection for making electrical contact with a second control module,
a first field connection for making electrical contact with a first industrial field device,
a second field connection for making electrical contact with a second industrial field device,
a data transmission medium for a transmission of communication data, and
a signal transmission medium for a transmission of field signals, the signal transmission medium comprising individual signal lines;
each of the first module connection and the second module connection comprising electrical contact elements which form a communication signal region and a field signal region,
contact elements of the communication signal region of the first module connection and contact elements of the communication signal region of the second module connection each being connected in an electrically conductive manner to the data transmission medium,
a contact element of the field signal region of the first module connection being connected to the first field connection via a first signal line of the signal transmission medium,
a further contact element of the field signal region of the first module connection being connected to the second field connection via a second signal line of the signal transmission medium,
a contact element of the field signal region of the second module connection being connected to the first field connection via a third signal line of the signal transmission medium, and
a further contact element of the field signal region of the second module connection being connected to the second field connection via a fourth signal line of the signal transmission medium.

2. The coupling unit as claimed in claim 1,
having a bus board, on which the two module connections and the field connection are arranged,
the bus board comprising the data transmission medium and the signal transmission medium,
the bus board being configured as a printed circuit board.

3. The coupling unit as claimed in claim 1,
the communication signal regions of each of the two module connections consisting of contact elements being arranged adjacent to one another and
the field signal regions of each of the two module connections consisting of contact elements being arranged adjacent to one another.

4. The coupling unit as claimed in claim 1,
the communication signal region of the two module connections respectively comprising a receiving contact element and a transmitting contact element, and
the transmitting contact element of a first module connection of the two module connections being connected to the receiving contact element of a second module connection of the two module connections in an electrically conductive manner via the data transmission medium, and
the transmitting contact element of the second module connection being connected to the receiving contact element of the first module connection in an electrically conductive manner via the data transmission medium.

5. The coupling unit as claimed in claim 1, the data transmission medium comprising a first data channel and a second data channel, and a first number of contact elements of the communication signal region of the first module connection and the second module connection respectively being connected to the first data channel in an electrically conductive manner, and a second number of contact elements of the communication signal region of the first module connection and the second module connection respectively being connected to the second data channel in an electrically conductive manner.

6. The coupling unit as claimed in claim 1, the data transmission medium being interrupted in the communication signal region of each module connection.

7. A coupling unit for an industrial control system, having two module connections for making electrical contact with control modules,
a field connection for making electrical contact with an industrial field device,
a data transmission medium for a transmission of communication data, and
a signal transmission medium for a transmission of field signals;
each of the two module connections comprising electrical contact elements which form a communication signal region and a field signal region,
contact elements of the communication signal regions of each of the two module connections being connected in an electrically conductive manner to the data transmission medium,
contact elements of the field signal regions of each of the two module connections being connected to the field connection via the signal transmission medium,
at least one of the two module connections having electrical contact elements which form a voltage supply region and are connected to a field voltage supply of the coupling unit in a conductive manner, and
the contact elements of the field signal region being arranged between the contact elements of the communication signal region and the contact elements of the voltage supply region.

8. A coupling unit for an industrial control system, having
two module connections for making electrical contact with control modules,
a field connection for making electrical contact with an industrial field device,
a data transmission medium for a transmission of communication data, and
a signal transmission medium for a transmission of field signals;
each of the two module connections comprising electrical contact elements which form a communication signal region and a field signal region, and
contact elements of the communication signal regions of each of the two module connections being connected in an electrically conductive manner to the data transmission medium;
the coupling unit having further module connections,
the module connections having a substantially rectangular form with long sides and short sides,
the long sides of the module connections being arranged substantially parallel to one another,
a first number of module connections being arranged at a distance from one another in a first row,
the contact elements of the communication signal regions of the first number of module connections being sequentially connected to one another along the first row in an electrically conductive manner via the data transmission medium,
a second number of module connections being arranged at a distance from one another in a second row,
the contact elements of the communication signal regions of the second number of module connections being sequentially connected to one another in an electrically conductive manner along the second row via the data transmission medium,
the second row being arranged below the first row and parallel to the first row,
a contact element of the communication signal region of a last module connection with which contact has been made in the first row being connected to a contact element of the communication signal region of a first module connection with which contact has been made in the second row in an electrically conductive manner via the data transmission medium.

9. The coupling unit as claimed in claim 8,
a third number of module connections being arranged at a distance from one another in a third row,
the third row being arranged parallel to the first row and in a manner adjoining the first row,
the contact elements of the communication signal regions of the third number of module connections being sequentially connected to one another in an electrically conductive manner along the third row via the at least one data transmission medium,
a contact element of the communication signal regions of a last module connection with which contact has been made in the second row being connected to a contact element of the at least one communication signal region of a first module connection with which contact has been made in the third row in an electrically conductive manner via the data transmission medium.

10. The coupling unit as claimed in claim 1, comprising a module connection board with the module connections and a field connection board with the field connection, the module connection board and the field connection board being connected in an electrically conductive manner via a connecting element.

11. The coupling unit as claimed in claim 10, the at least one module connection board and the at least one field connection board being connected to one another in an electrically conductive manner via at least one further connecting element, the contact elements of the field signal regions of a first group of module connections being connected to the at least one connecting element in an electrically conductive manner, and the contact elements of the field signal regions of a second group of module connections being connected to the at least one further connecting element in an electrically conductive manner.

12. An industrial control system having
a coupling unit,
a control module, and
a converter module,
the coupling unit having a module connection and a converter module connection,
the module connection comprising electrical contact elements, which form a communication signal region and a field signal region,
the converter module connection comprising electrical contact elements, which form a communication signal region,
the contact elements of the communication signal region of the module connection and the converter module connection making electrically conductive contact to a data transmission medium of the coupling unit,
the control module being designed to make electrically conductive contact with contact elements of the module connection in order to transmit communication data via the contact elements of the communication signal region of the module connection and to transmit field signals to an industrial field device via the contact elements of the field signal region of the module connection,
the converter module being designed to make electrically conductive contact with contact elements of the converter module connection,
the converter module having an interface to a superordinate data path,
the converter module being designed to transmit the communication data between the interface to the superordinate data path and contact elements of the communication signal region of the converter module connection.

13. The industrial control system as claimed in claim 12, the coupling unit having
a further module connection,
a field connection for making electrical contact with the industrial field device, and
a signal transmission medium,
contact elements of the communication signal regions of the further module making electrically conductive contact with the data transmission medium, and
contact elements of the field signal regions of the module connection and the further module connection being conductively connected to the field connection via the signal transmission medium.

14. The industrial control system as claimed in claim 12, the converter module being designed to transmit the communication data via the superordinate data path and the data transmission medium using different physical layer transmission technologies.

15. The industrial control system as claimed in claim 12, the converter module, the control module and the data transmission medium being designed to transmit the communication data via the data transmission medium using E-bus data messages.

16. The industrial control system as claimed in claim 12, the converter module being designed to transmit the communication data via the superordinate data path using Ethernet data messages, in particular using EtherCAT data messages.

17. The industrial control system as claimed in claim 12,
a part of the superordinate data path being arranged on the coupling unit,
the superordinate data path making electrically conductive contact with contact elements of the converter module connection.

18. An industrial control system having
a coupling unit,
a control module, and
a placeholder module,
the coupling unit having a module connection and a further module connection, the module connection and the further module connection each comprising electrical contact elements, which form a communication signal region and a field signal region,
the control module being designed to make electrically conductive contact with contact elements of the communication signal region of the module connection in order to transmit communication data and to make electrically conductive contact with contact elements of the field signal region of the module connection in order to transmit field signals,
the placeholder module being designed to make electrically conductive contact with contact elements of the communication signal region of the further module connection in order to transmit communication data,
the placeholder module being designed to forward communication data to the control module, and
the placeholder module being designed to amplify and/or smooth data signals representing the communication data prior to forwarding the communication data to the control module.

19. An industrial control system having
a coupling unit,
a control module, and
a placeholder module,
the coupling unit having a module connection and a further module connection, the module connection and the further module connection each comprising electrical contact elements, which form a communication signal region and a field signal region,
the control module being designed to make electrically conductive contact with contact elements of the communication signal region of the module connection in order to transmit communication data and to make electrically conductive contact with contact elements of the field signal region of the module connection in order to transmit field signals,
the placeholder module being designed to make electrically conductive contact with contact elements of the communication signal region of the further module connection in order to transmit communication data, and the placeholder module being designed to forward communication data to the control module;

the industrial control system having a control computer, the control computer being designed to interchange communication data with the control module and the placeholder module, and the control computer being designed to determine a number of module connections from communication data received from the control module and the placeholder module.

20. The industrial control system as claimed in claim 19, the placeholder module and the control module being designed to insert module-specific identifiers into the communication data received by the control computer in order to determine the number of module connections.

21. The industrial control system as claimed in claim 20, the control module being designed to insert individual identifiers as module-specific identifiers that specify the control module being an input module or an output module.

22. The industrial control system as claimed in claim 20, the control module being designed to insert individual identifiers as module-specific identifiers that specify the control module being an analog module or a digital module.

23. The industrial control system as claimed in claim 20, the module-specific identifiers being MAC-addresses.

* * * * *